United States Patent [19]

Nakagawa

[11] Patent Number: 5,039,354
[45] Date of Patent: Aug. 13, 1991

[54] STACKED PHOTOVOLTAIC DEVICE WITH ANTIREFLECTION LAYER

[75] Inventor: Katsumi Nakagawa, Nagahama, Japan

[73] Assignee: Canon Kabushiki Kaisha, Tokyo, Japan

[21] Appl. No.: 429,453

[22] Filed: Oct. 31, 1989

[30] Foreign Application Priority Data

Nov. 4, 1988 [JP] Japan .................. 63-277283
Oct. 18, 1989 [JP] Japan .................. 1-268993

[51] Int. Cl.⁵ .................................. H01L 31/075
[52] U.S. Cl. .................................. 136/249
[58] Field of Search .................... 136/249 TJ

[56] References Cited

U.S. PATENT DOCUMENTS

| | | | |
|---|---|---|---|
| 2,949,498 | 10/1955 | Jackson | 136/249 TJ |
| 4,379,943 | 4/1983 | Yang et al. | 136/249 |
| 4,471,155 | 9/1984 | Mohr et al. | 136/258 |
| 4,542,256 | 9/1985 | Wideman | 136/249 |
| 4,547,621 | 10/1985 | Hack et al. | 136/249 TJ |
| 4,737,653 | 4/1988 | Nakagawa et al. | 250/578 |
| 4,851,302 | 7/1989 | Nakagawa et al. | 428/658 |
| 4,888,062 | 12/1989 | Nakagawa et al. | 136/258 PC |

FOREIGN PATENT DOCUMENTS

| | | | |
|---|---|---|---|
| 55-111180 | 8/1980 | Japan | 136/249 TJ |
| 55-125680 | 9/1980 | Japan | 136/249 TJ |
| 58-116779 | 7/1983 | Japan | 136/249 TJ |
| 58-139478 | 8/1983 | Japan | 136/249 TJ |
| 60-111478 | 6/1985 | Japan | 136/249 TJ |

OTHER PUBLICATIONS

J. C. C. Fan, SPIE, vol. 543 (1985), pp. 30–39.
M. E. Nell et al, *Conference Record, 18th IEEE Photovoltaic Specialists Conf.* (1985), pp. 116–121.

*Primary Examiner*—Aaron Weisstuch
*Attorney, Agent, or Firm*—Fitzpatrick, Cella, Harper & Scinto

[57] ABSTRACT

An improved stacked type photovoltaic device comprises a plurality of stacked photovoltaic elements wherein at least one element thereof comprises a semiconductor layer (a) having a refractive index na and a semiconductor layer (b) having a refractive index nb and a semiconductor layer (c) is inserted therebetween as an antireflection layer; wherein said semiconductor layer (c) has constitutent elements having a composition ratio different from the composition ratio of the constituent elements of both said semiconductor layer (a) and (b) and said semiconductor layer (c) has a refractive index $nc = \sqrt{na.nb}$ and a thickness $d = \lambda/4\sqrt{na.nb}$, in which $\lambda$ represents a peak wavelength of the spectral sensitivity of an adjacent photovoltaic element positioned in the direction of light transmission.

The semiconductor layer (c) may also be constituted by a semiconductor film having an elemental composition comprising other elements in addition to the constituent elements of the semiconductor layer (b).

10 Claims, 8 Drawing Sheets

STACKED PHOTOVOLTAIC DEVICE WITH ANTIREFLECTION LAYER

BACKGROUND OF THE INVENTION

1. Field of the Invention

The present invention relates to an improved stacked photovoltaic device having an antireflection layer which excels in photovoltaic properties and provides an improved photoelectric conversion efficiency. More particularly, the present invention relates to an improved stacked photovoltaic device comprising a plurality of photovoltaic elements (cells) and including an antireflection layer provided in the interface between two constituent semiconductor layers which excels in photovoltaic properties and provides an improved photoelectric conversion efficiency.

2. Background Of The Invention

As a photovoltaic device for power sources of civilian equipment, solar cells, etc., there has been proposed a photovoltaic device utilizing a pn junction formed by ion spiking or thermally diffusing impurities into a single crystal substrate, for example( made of silicon (Si) or gallium arsenide (GaAs), or formed by epitaxially growing a layer doped with impurities on such a single crystal substrate. However, since the device uses a single crystal substrate as described above, it requires a high temperature process exceeding 1000° C. upon production and it is difficult to fabricate the substrate into a thickness of several hundreds of micrometers or below, reduction of the cost is not easily attained.

A hydrogenated amorphous silicon (hereinafter referred to as "a-Si:H") photovoltaic device proposed by D. E. Carlson in 1976 can be produced by depositing an a-Si:H layer to a thickness of less than 1 μm at a temperature of lower than 300° C. on an inexpensive substrate such as glass and, accordingly, remarkable cost reduction can be expected. In view of this, various researches have been made therefor.

Further, the performance of the device has been improved in recent years, to such an extent of about 10–12% of photoelectric conversion efficiency with a device of small area, as can be applied to solar cells for a power supply.

Further, in the a-Si:H photovoltaic device and the photovoltaic device using an alloy of a-Si:H (they are hereinafter referred to as "a-Si:H system photovoltaic device"), a structure capable of effectively utilizing photon energy in a wide range of wavelength components of sunlight can be attained by successively stacking layers of different optical band gaps (Eg) or conduction types.

The features of the a-Si:H system photovoltaic device will be described below.

As shown in FIG. 5, since sunlight has a peak at a wavelength of about from 500 nm to 600 nm and has components ranging from 300 nm to 1500 nm, it is desirable for a solar cell to absorb wavelength components in a range as wide as possible. By the way, the wavelength region of light that can be absorbed in a solar cell is generally determined by the optical band gap (hereinafter referred to as "Eg") of semiconductors used in the solar cell. Generally, a semiconductor can absorb only light of wavelength shorter than light of energy corresponding to Eg.

Since there is an approximate relationship between the energy hν (unit: eV) and the wavelength ν (unit: nm) of the light given as: λ=1240/hν, a semiconductor of smaller Eg can utilize light of longer wavelength. For instance, since an a-Si:H semiconductor layer prepared by using monosilane (SiH₄) as the starting material gas by means of a glow discharge decomposition method (GD method) has an Eg of about 1.7 eV, it can absorb sunlight of 300 nm to 730 nm in wavelength. Further, an a-SiGe:H semiconductor film prepared by using SiH₄ gas and germane gas (GeH₄) as the starting material gases by the GD method is advantageous since it has an Eg of about 1.4 eV and can absorb sunlight of 300 nm to 885 nm in wavelength and, accordingly, the number of electron-hole pairs to be excited is great and as a result, more short-circuit photocurrent (hereinafter referred to as "Isc") can be obtained.

On the other hand, since an a-SiC:H film prepared from SiH and CH as the starting material gases by the GD method has an Eg of about 2.0 eV, it can absorb the sunlight only within a range of wavelength from 300 nm to 620 nm and Isc is small, thus there is a difficulty in applying to a solar cell.

By the way, as a factor for determining the efficiency of a solar cell, there is the open circuit voltage (hereinafter referred to as "Voc") in addition to the Isc. The value of Voc tends to increase as Eg of the semiconductor layer used (particularly, an i-type layer) becomes greater. For instance, when a non-doped a-Si:H film is used as the i-type layer, the value for 0.7 V when using the above-mentioned non-doped a-SiGe:H film as the i-type layer. Further, if the non-doped a-SiC:H film is used, the value of Voc is about 1.1 V. Accordingly, it is recognized that the voltage is low although the photocurrent is large in the semiconductor film of small Eg. On the other hand, in a semiconductor film of large Eg, although the voltage is high and there is an advantage that the great energy possessed by photons of short wavelength light can be used effectively, it has a drawback of not being capable of absorbing longer wavelength light and the photocurrent is small.

Accordingly, conventional photovoltaic devices still have a drawback that the energy of a wide range of wavelength components in the sunlight can not sufficiently be utilized.

The foregoing is not related only to the a-Si system photovoltaic devices. Similar relationships between Eg and solar cell characteristics can also be recognized in the photovoltaic devices using other kinds of semiconductor materials.

E. D. Jackson proposed an idea for improving the foregoing situation in 1960 (refer to U.S. Pat. No. 2,949,498). In his proposal, a plurality of photovoltaic elements using semiconductor materials of different Eg values are stacked in such an order that the Eg value becomes smaller from the side of incident light and the elements are connected in series. With such a constitution, light of short wavelength (high energy) is absorbed in the photovoltaic elements using semiconductors of large Eg and the energy thereof is effectively outputted as a voltage. On the other hand, light of long wavelength that can not be absorbed in these photovoltaic elements is absorbed in photovoltaic elements using semiconductors of small Eg, whereby the energy of light of wavelength components within a wide range of the sunlight is effectively utilized. However, the proposal employs a complicated structure in which three kinds of photovoltaic elements prepared independently are connected in series by way of wirings and this lacks in practical usefulness in view of the production cost, reliability, etc.

Further, photovoltaic devices in which a plurality of a-Si photovoltaic elements are stacked have been proposed by Japanese patent Laid-open Sho.55(1980)-111180 and Sho.55(1980)-125680. According to these proposals, since any desired number of a-Si:H layers can be stacked as the layers having necessary conduction type and there is no requirement for connecting individual photovoltaic elements in series by means of wirings, practical utility may be obtained to some extent. However, it has not been intended in these proposals to effectively utilize the light energy in terms of Eg for each of the semiconductors of the photovoltaic elements. Further, Japanese Patent Laid-open Sho. 58(1983)-116779 and Sho. 58(1983)-139478 have proposed a-Si:H system photovoltaic devices in which photovoltaic elements of different Eg are stacked, but these proposals are similar to those made by Jackson described above.

None of these photovoltaic devices having a stacked structure (hereinafter referred to as "stacked type photovoltaic device") can sufficiently satisfy the characteristic requirements of a photovoltaic device, particularly, photoelectric conversion efficiency, and there is much room for improvement.

SUMMARY OF THE INVENTION

An object of the present invention is to provide an improved stacked type photovoltaic device, free of the foregoing problems found in the conventional stacked type photovoltaic devices, having excellent characteristics as a photovoltaic device and improved high photoelectric conversion efficiency.

The present invention which attains the above object includes the following two representative aspects.

An aspect of the present invention is to provide an improved stacked type photovoltaic device which comprises a plurality of photovoltaic elements being stacked wherein a semiconductor layer (a) with a refractive index (n) of na and a semiconductor layer (b) with a refractive index (n) of nb defines therebetween an interface in which a semiconductor layer (c) is inserted as an antireflection layer, and the semiconductor layer (c) comprises a semiconductor film in which constituent elements have a composition ratio different from the composition ratio of the constituent elements for the semiconductor layer (b), its refractive index (n) being $nc = \sqrt{na \cdot nb}$, and its thickness (d) being $d = \lambda/4nc$ in which $\lambda$ represents a peak wavelength of the spectral sensitivity of an adjacent photovoltaic element positioned in the direction of light transmission.

Another aspect of the represent invention is to provide an improved stacked type photovoltaic device which comprises a plurality of photovoltaic elements being stacked wherein a semiconductor layer (a) with a refractive index (n) of na and a semiconductor layer (b) with a refractive index (n) of nb defines therebetween an interface in which a semiconductor layer (c) is inserted as an antireflection layer, and the semiconductor layer (c) comprises a semiconductor film having an element composition in which other elements are added to the constituent elements for the semiconductor layer (b), its refractive index (n) being $nc = \sqrt{na \cdot nb}$, and its thickness (d) being $d = \lambda/4nc$ in which $\lambda$ represents a peak wavelength of the spectrum sensitivity of an adjacent photovoltaic element positioned in the direction of light transmission.

According to the present invention, since it is not required to provide any specific film-forming apparatus for forming films and an optically ideal antireflection layer can be introduced in the interface between different kinds of semiconductor layers without interrupting the film formation, it is possible to provide a desired stacked type photovoltaic device having a high photoelectric conversion efficiency with low production cost.

DESCRIPTION OF THE INVENTION

The present invention has been accomplished on the basis of the findings obtained through the following experiments by the present inventor.

EXPERIMENTS

Figure 3:
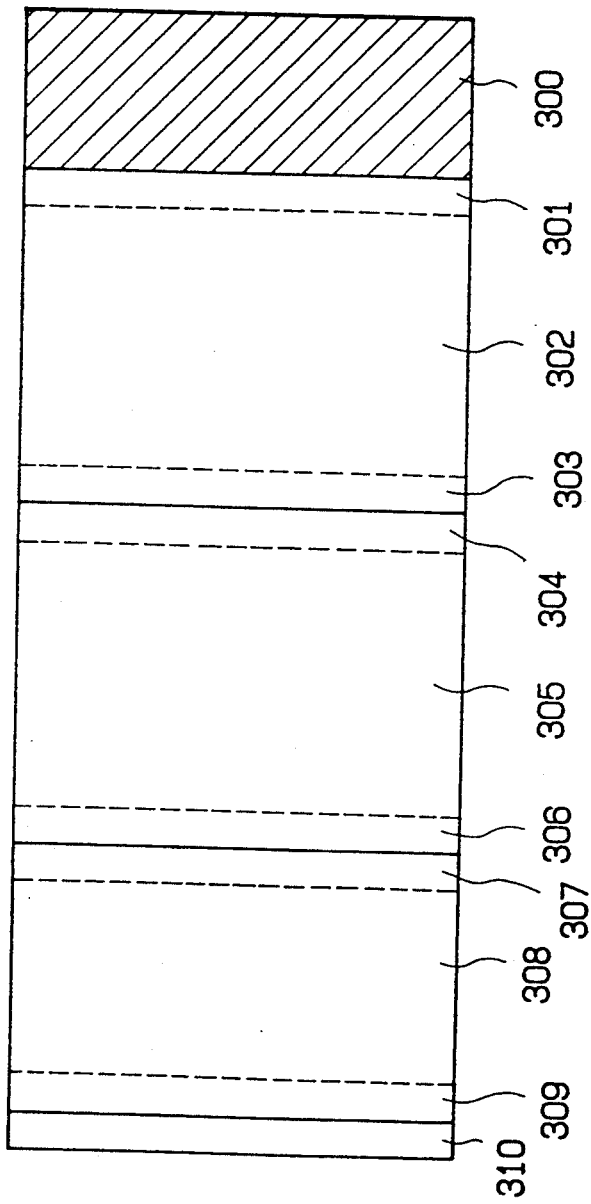
FIG. 3 is an embodiment of a conventional stacked type photovoltaic device in which three pin-type photovoltaic elements are stacked.

The present inventor has made studies on an a-Si:H system photovoltaic device prepared by stacking three photovoltaic elements as shown in FIG. 3. In FIG. 3, a substrate 300 is a stainless steel plate. On the substrate 300, there are provided respectively, a bottom cell comprising an n-type semiconductor layer 301 constituted with an n-type a-Si:H film, an i-type semiconductor layer 302 constituted with a non-doped a-SiGe:H film and a p-type semiconductor layer 303 constituted with a p-type a-Si:H film; a middle cell comprising an n-type semiconductor layer 304 constituted with an n-type a-Si:H, an i-type semiconductor layer 305 constituted with a non-doped a-Si:H film, and a p-type semiconductor layer 306 constituted with a p-type a-SiC:H film; a top cell comprising an n-type semiconductor layer 307 constituted with an n-type a-SiC:H film, an i-type semiconductor layer 308 constituted with a non-doped a-SiC:H film and a p-type semiconductor layer 309 constituted with a p-type a-SiC:H film; and a transparent electrode 310 constituted with an ITO film.

As a result of the studies on this photovoltaic device, it has been found that the following are important factors for improving the characteristics (in particular, Isc) of the stacked photovoltaic device.

(1) It is necessary to adjust the film thickness of respective photovoltaic elements such that ISc values for the bottom cell, middle cell and top cell are substantially equal to each other when they are stacked, because the entire Isc is determined by the photovoltaic element with the least Isc among the three photovoltaic elements.

(2) It is necessary that the thickness of the p-type layer and/or n-type layer is made as thin as possible, because the light absorbed in the p-type layer or n-type layer in the a-Si:H system photovoltaic device scarcely contributes to Isc. However there is a limit to such thickness reduction since undesirable side effects such as reduction of Voc are observed if the thickness is reduced excessively. The limit of the thickness is about 100Å.

The present inventor has made further studies for improving the characteristics of the stacked photovoltaic device and found the following problems.

Since the semiconductors of different Eg values often have different refractive indexes (n), Isc loss is caused due to light reflection occurring at the interface. In order to demonstrate this, the following experiments have been conducted.

A. Preparation and Evaluation of a-$Si_{1-x}Ge_x$:H Film a-SiGe:H films of various Ge concentrations were prepared by using the capacitive coupled glow discharge film-forming apparatus shown in FIG. 6. Each of the resultant films was evaluated for refractive index, etc.

The characteristics of the a-SiGe:H film vary depending on the composition ratio x for Ge (the ratio of number of Germanium and Silicon atoms, excluding H atoms or impurity atoms). Accordingly, an a-SiGe:H film is represented as "a-$Si_{1-x}Ge_x$:H film".

Figure 6:
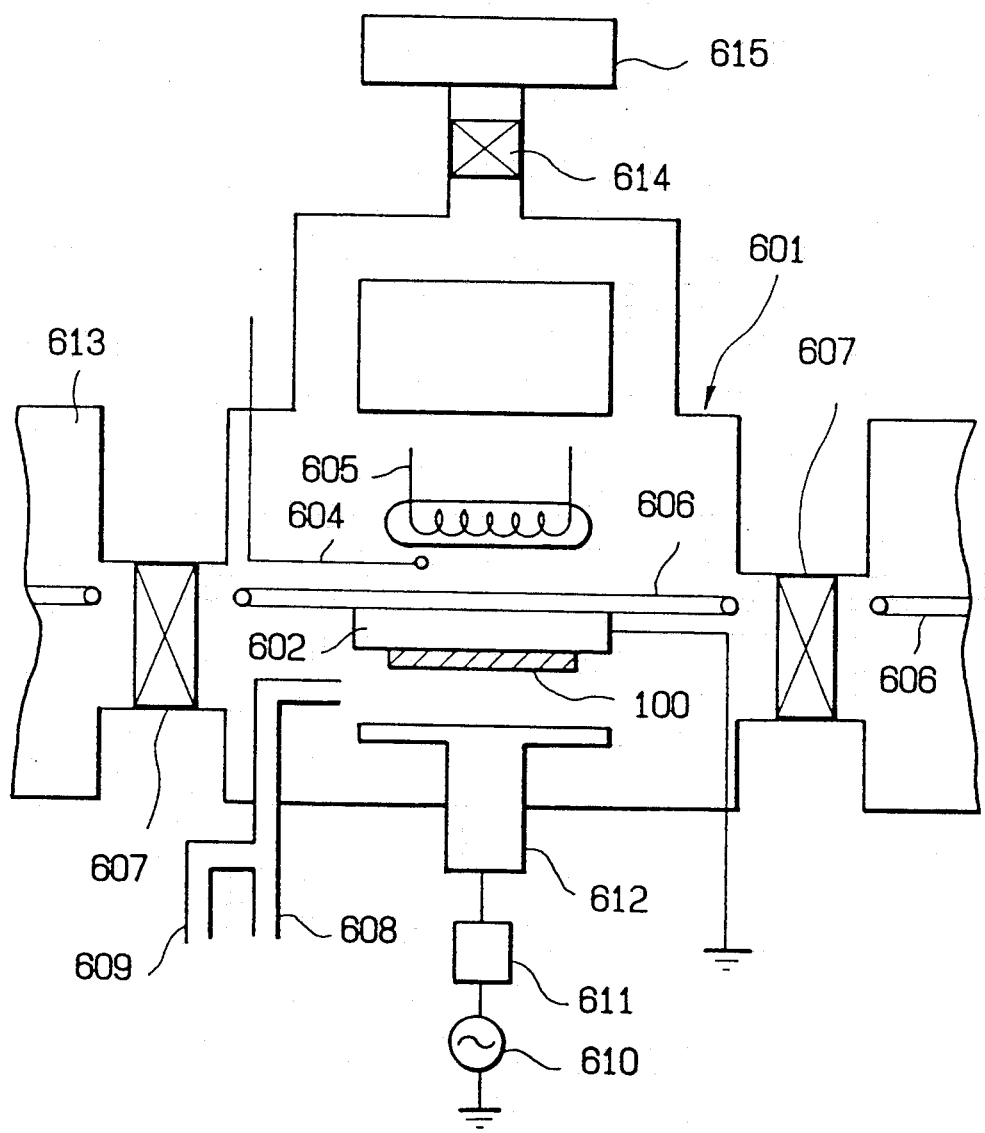
FIG. 6 is a schematic explanatory view for a capacitive coupled glow discharge film-forming apparatus used for preparing specimens in Experiments and Examples to be described later.

In FIG. 6, there are shown a substrate 100, a film-forming chamber 601, a substrate holder 602, a temperature monitor 604, an electric heater 605, a substrate transportation means 606, gate valves 607, gas feed pipes 608, 609, a RF power source 610, a matching circuit 611, a cathode electrode 612, another film-forming chamber 613, an exhaust valve 614, and an exhaust pump 615. This apparatus is an example of one type suitable for practicing the capacitive coupled glow discharge film-forming method.

A glass substrate 100 comprising a No. 7059 glass plate, manufactured by Corning Glass Works, was mounted on the substrate holder 602 and the inside of the film-forming chamber 601 was evacuated to bring the inner pressure to below 10 Torr. Then, the substrate 100 was heated by the heater 605 to 250° C. and it was kept at this temperature. Then, there were introduced SiH gas at a flow rate of 30 sccm and H₂ gas at a flow rate of 40 sccm through the respective gas feed pipes 608, 609. The inner pressure was maintained at about 0.5 Torr by adjusting the exhaust valve 614, and a RF power of 50 W was applied to thereby deposit an a-Si:H film of about 1 μm in thickness to obtain Specimen A-0.

Then, Specimen A-1 was obtained by using the same apparatus and under the same film-forming conditions as those employed for the preparation of Specimen A-0 except for introducing GeH₄ gas at a flow rate of 0.8 sccm in addition to the SiH₄ gas and the Hz gas wherein the same kind of substrate was used. Likewise, there were prepared Specimens A-2, A-3 and A-4 by introducing GeH gas at the respective flow rates of 1.2 sccm, 2.5 sccm and 4 sccm.

Then, for each of the thus obtained Specimens A-0 to A-4, the refractive index was determined by polarization analysis using semiconductor laser beams (oscillation wavelength at 7500 Å). Then, for identical specimens, optical absorption coefficient α was determined by near infrared-visible light spectral transmission spectroscopy to evaluate the band gap Eg. Further, the composition ratio x for Ge in each of the specimens was determined by the X-ray microanalysis (XMA) method. The results obtained were as shown in Table 1.

B. Preparation and Evaluation of A-$Si_{1-x}C_x$:H Film

A-$Si_{1-x}C_x$:H films of various C concentrations were prepared by the foregoing method using the capacitive coupled glow discharge film-forming apparatus shown in FIG. 6. Each of the resultant films was evaluated for refractive index, etc.

In each case, the film-forming conditions were 300° C. for the substrate temperature, 30 sccm for the flow rate of SiH₄ gas, 40 sccm for the flow rate of H₂ gas, 0.5. Torr for the inner pressure and 100 W for the RF power applied. The flow rate of CH₄ gas was changed for the respective cases.

Specimen B-0 was prepared without introducing CH₄ gas. Specimen B-1 was prepared by introducing CH₄ gas at a flow rate of 4.5 sccm. Specimen B-2 was prepared by introducing CH₄ gas at a flow rate of 6.5 sccm. Specimen B-3 was prepared by introducing CH₄ gas at a flow rate of 9.5 sccm. Specimen B-4 was prepared by introducing CH₄ gas at a flow rate of 15 sccm.

For each of the thus obtained Specimens B-0 to B-4, the refractive index n was determined by He-Ne laser beams (oscillation wavelength at 6328 Å) by polarization analysis. Then, the band gap Eg and the composition ratio x for C were determined in the same manner as those for the a-$Si_{1-x}Ge_x$:H film in the foregoing. The results obtained were as shown in Table 2.

C. Measurement of Spectral Sensitivity for Stacked Photovoltaic Device

The spectral sensitivity for the stacked photovoltaic device shown in FIG. 3 was measured as described below. Light of a xenon lamp passed through a monochrometor was irradiated by way of a chopper to the surface of the photovoltaic device, a bias voltage at ⅔ level of Voc was applied with a reverse polarity and the current output was detected by a lock-in amplifier. In this case, light from a halogen lamp was irradiated as a bias light through a color glass filter R-60 manufactured by Toshiba Glass Co., upon observing Isc of the top cell, to establish conditions where sufficient current flowed to the middle cell and the bottom cell, whereby the Isc that flowed through the entire device was determined by the top cell. The quantum yield Q at each wavelength was determined based on the ratio between the number of photons of the monochromatic light and Isc.

In the same way, a C-39A filter was used for the bias light for observing Isc in the middle cell and a B-48S filter was used for observing Isc in the bottom cell. The results obtained were as shown in FIG. 4.

D. Reflection of Light at the Interface between Different Kinds of Semiconductors In the examination for the captioned item, an a-$Si_{0.6}Ge_{0.4}$:H film was used as the A-$Si_{1-x}GE_x$:H film in which x=0.4 and an a-$Si_{1-x}Ge_x$:H film was used as the a-$Si_{1-x}C_x$:H film (x=0.3) in the stacked photovoltaic device shown in FIG. 3 for recognizing the problems. The constitution of the stacked photovoltaic device shown in FIG. 3, when classified according to the optical property of the semiconductor, is as shown in Table 3.

Figure 4:
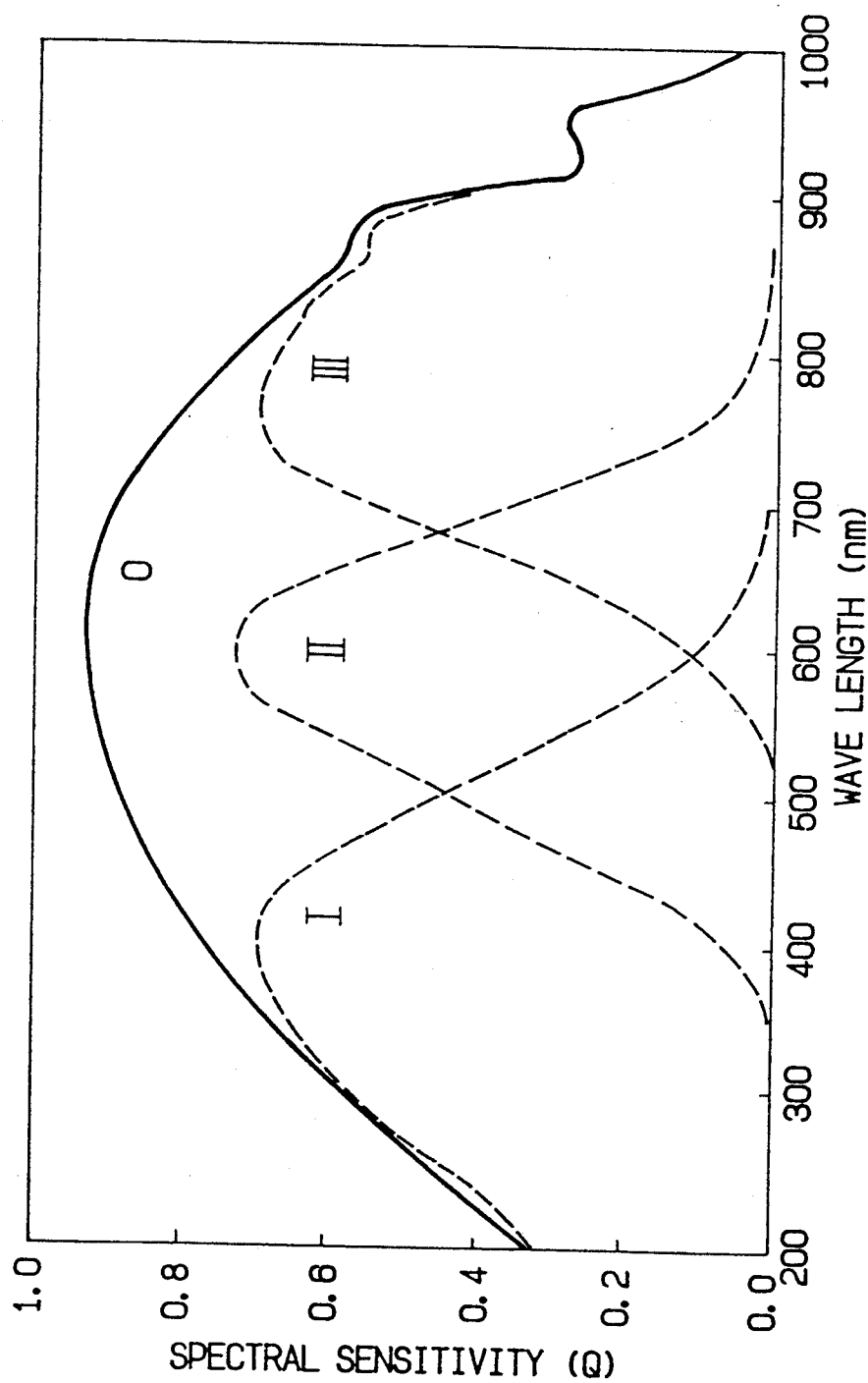
FIG. 4 is a spectral sensitivity curve of a stacked photovoltaic device in which three pin-type photovoltaic elements are stacked
Figure 5:
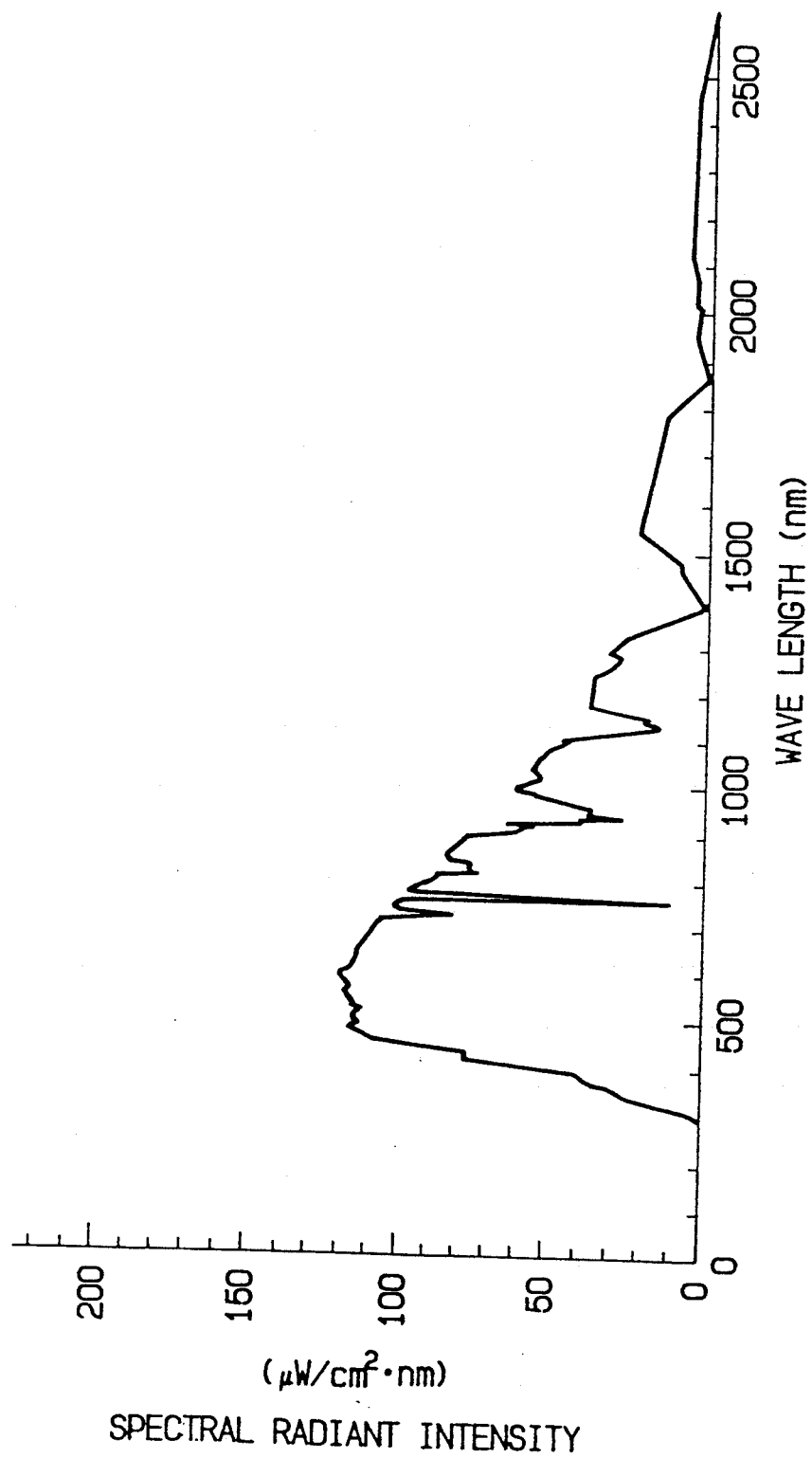
FIG. 5 is a graph illustrating the wavelength dependency of the radiant intensity of the sunlight.

As seen in FIG. 4, while the peak wavelength for the spectral sensitivity of the middle cell is about 600 nm, there is a considerable difference in the refractive index at that wavelength, i.e.: n(a-Si$_{0.7}$C$_{0.3}$:H)=2.7 and n(a-Si:H)=4.0. Further, while the peak wavelength for the spectral sensitivity of the bottom cell is about 750 nm, there is also a considerable difference in refractive index at that wavelength, i.e.: n(a-Si:H)=3.6 and n(a-Si$_{0.6}$Ge$_{0.4}$:H)=5.0. It has been known that when light is impinged perpendicular to the interface between a medium a and a medium b having such a difference in the refractive index n, the light is reflected at a ratio:

$$R = \left[\frac{n_b/n_a - 1}{n_b/n_a + 1}\right]^2 = \left[\frac{n_b - n_a}{n_b + n_a}\right]^2$$

(see. Max Born & Emil Wolf, "Principles of Optics", published by Pergamon Press Inc.).

When the above formula is employed by substituting the values in Table 1 (a-SiGe film) and Table 2 (a-SiC film), the following result is obtained.

Namely, it is understood that there is a relationship at the interface between the a-Si:H film and the a-SiC Si$_{0.7}$C$_{0.4}$:H film represented by the equation:

$$R(SiC-Si) = \left[\frac{4.0 - 2.7}{4.0 + 2.7}\right]^2 = 0.038$$

It is also understood that there is a relationship at the interface between the a-Si:H film and the a-Si$_{0.4}$Ge$_{0.4}$:H film represented by the equation:

$$R(Si-SiGe) = \left[\frac{5.0 - 3.6}{5.0 + 3.6}\right]^2 = 0.027$$

From the above, it is understood that a non-negligible loss of incident light of as much as 3 to 4% occurs at each of the interfaces. The reflection of light at each interface can be reduced by inserting a thin film having an appropriate refractive index n and thickness d (hereinafter referred to as "antireflection layer") into the interface. In this instance, the optimum refractive index (n) is: $n = \sqrt{n_a \cdot n_b}$ and the thickness (d) is: $d = \lambda/4n$ when the wavelength of light for which the reflection is intended to be maximally reduced is made λ. As materials generally used for antireflection layers, there are known TiO$_2$, CeO$_2$, SiO$_2$, CaF$_2$, MgF$_2$, etc. However, they involve the following problems (1) to (3) and cannot be employed at present. (1) Since their refractive index n is smaller than 2.5, they cannot be used as an antireflection layer between the semiconductors with refractive index n being greater than 2.5.

(2) Any of the materials described above is dielectric and inhibits current passage in the photovoltaic device.

(3) An additional production process is required for depositing an antireflection layer, which makes the production apparatus complicated.

The present inventor has made further studies, and as a result, has found that the foregoing problems can be overcome by using as an antireflection layer at the interface between different kinds of semiconductors a and semiconductors b respectively having different refractive indexes, (i) a semiconductor film in which the composition ratio for the elements constituting the semiconductor b is changed or (ii) a semiconductor film having an elemental composition in which an additional element is added to the semiconductor b.

For instance, since n=3.6 for an a-Si:H film and n=5.0 for a-Si$_{0.6}$Ge$_{0.4}$:H at λ=750 nm as described above, it is desirable that the antireflection layer has a refractive index: $n = \sqrt{3.6 \times 5.0} = 4.24$. As can be seen from Table 1, n=4.2 for the a-Si$_{0.86}$Ge$_{0.14}$ film, which is substantially a desired value. When the thickness (d) is made: d=750/4×4.2=44.6 (nm), the conditions for an antireflection layer can be satisfied. Then, since the layer is made of a semiconductor film prepared by changing the elemental composition of the i-type layer in the bottom cell, it can be prepared continuously in a single apparatus.

Further, since n=2.7 for the a-Si$_{0.7}$C$_{0.3}$:H film and n=4 for the a-Si:H film respectively at λ=633 nm, it is desirable that the antireflection layer has a refractive index: $n = \sqrt{2.7 \times 4.0} = 3.29$. According to the Table 2, n=3.3 for a —Si$_{0.87}$C$_{0.13}$ film, which is a desirable value. When the layer thickness (d) is made: d=633/4×3=48.0 (nm), the conditions for an antireflection layer can be satisfied. Then, since the film is made of a semiconductor film prepared by adding C to the elements for the i-layer in the middle cell, it can be prepared continuously in a single apparatus. Further, since these layers are semiconductor films and have elemental compositions relatively similar to other semiconductor layers, they give no undesired effects on the electrical properties of the photovoltaic device.

Figure 1:
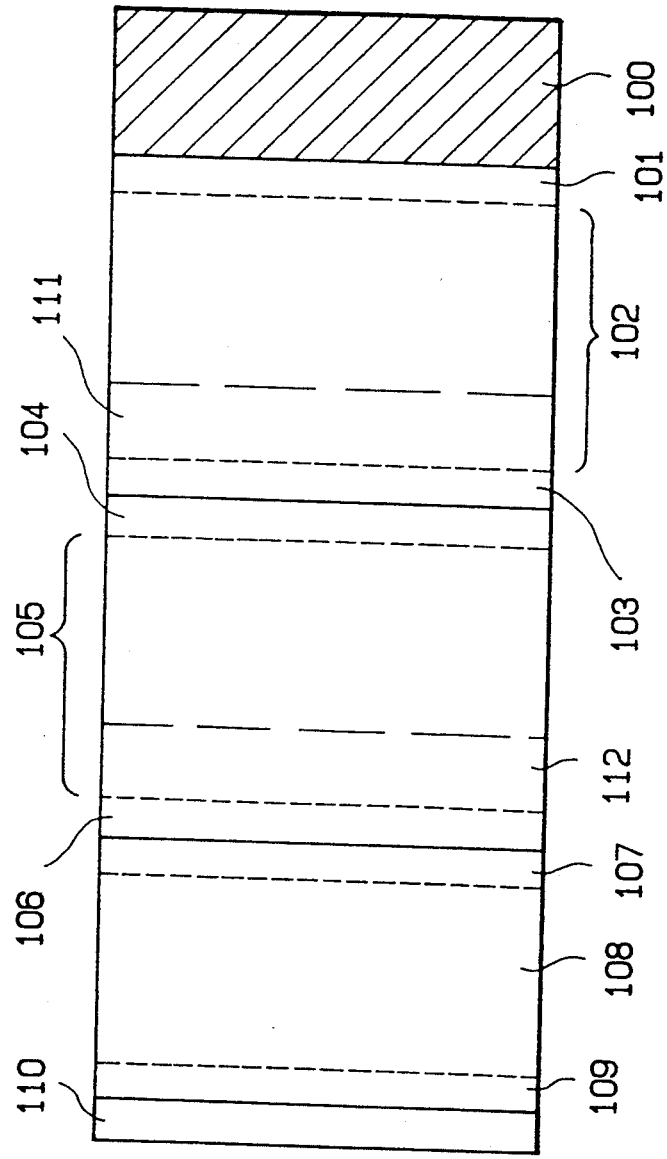
FIG. 1 is an embodiment of a stacked type photovoltaic device in which three pin-type photovoltaic elements are stacked according to the present invention.

E. Stacked Photovoltaic Device Using Antireflection Layer and Characteristics Thereof FIG. 1 shows a representative constitution of a stacked photovoltaic device using an antireflection layer.

A substrate 100 is a stainless steel plate. It may be made of a plate of other metal such as aluminum, copper or nickel, or may be a plate made of non-conductive material such as glass, synthetic resin, for example, polyimide resin or ceramics having a F electrode disposed at the surface thereof.

On the substrate 100, there are disposed successively a bottom cell comprising an n-type semiconductor layer 101 constituted with an n-type a-Si:H film, an i-type semiconductor layer 102 the main portion of which is comprised of a-Si$_{0.4}$Ge$_{0.4}$:H film and a p-type semiconductor layer 103 constituted with a p-type a-Si:H film; a middle cell comprising an n-type semiconductor layer 104 constituted with an n-type a-Si:H film, an i-type semiconductor layer 105 the main portion of which is comprised of an a-Si:H film and a p-type semiconductor layer 106 constituted with a p-type a-Si:$_{0.7}$C$_{0.3}$:H film; a top cell comprising an n-type semiconductor layer 107 constituted with an n-type a-Si$_{0.7}$C$_{0.3}$:H film, an i-type semiconductor layer 108 constituted with an a-Si$_{0.7}$C$_{0.3}$:H film and a p-type semiconductor layer 109 constituted with a p-type a-Si$_{0.7}$C$_{0.3}$:H film; and a transparent electrode 110 which is constituted with a transparent oxide semiconductor such as ITO or SnO$_2$. The thickness of said electrode is desirably made about 700 Å so that the antireflection effect at the surface of the semiconductor is at a maximum. Further, if the surface resistivity of the transparent electrode is not sufficiently low, a collection electrode may be disposed thereon.

An antireflection layer 111 comprising an a-Si$_{0.86}$Ge$_{0.14}$:H film is disposed on the light incident side of the i-type semiconductor layer 102 in the bottom cell. Further, an antireflection layer 112 comprising an a-Si$_{0.87}$C$_{0.13}$:H film is disposed on the light incident side of the i-type semiconductor layer 105 in the middle cell. The thickness of each of the semiconductor layers is shown in Table 4.

Evaluation of the Characteristics of the Solar Cells by AM-1 Light Irradiation

For demonstrating the effects of the antireflection layer, four kinds of specimens shown in Table 5 were provided. The specimen SC-1 was made to have a layer thickness and constitution as shown in Table 4. For specimens other than the specimen SC-1, the thickness of the i-type layer, even in the case where there was no antireflection layer, was made equivalent to the thickness of the i-type layer including the antireflection layer of the specimen SC-1. For instance, the thickness of the i-type layer of the specimen SC-2 in the middle cell was made 498 nm.

The characteristics of the solar cells were evaluated by a solar simulator having a spectrum similar to AM-1 light. The results of the measurements of Isc and $\eta$ for each of the specimens are shown in Table 6.

It has been confirmed from the results of Table 6 that Isc is the greatest in the case of the specimen SC-1 in which the antireflection layer is disposed in both the bottom cell and the middle cell, whereas Isc was the smallest in the case of the specimen SC-4 containing no antireflection layer at all and, thus, a desirable antireflection effect can be recognized.

Although description has been made of the a-SiGe:H film and the a-SiC:H film of predetermined compositions for the above-mentioned discussion, the present invention is also applicable to a-SiGe:H films or a-SiC:H films of other compositions in a wider range.

Further, although the description has been made so far for photovoltaic devices using a-Si:H system semiconductors, the present invention is not restricted to the use of a-Si:H system semiconductors For demonstrating this situation, a stacked photovoltaic device using the ZnSe:H semiconductor system will be examined in the following.

F. Preparation and Evaluation of ZnSe$_{1-x}$Te$_x$:H Film

Although a ZnSe film has been considered suitable as a semiconductor material to be used in the top cell since the band gap Eg is wide, it has been difficult to obtain a ZnSe film having desired characteristics by the conventional film-forming process. The present inventor previously had studied the formation of a ZnSe film by a HR-CVD process (hydrogenated radical assisted CVD) as disclosed in Japanese Patent Laid-open Sho.61(1986) - 189649 and Sho.61(1986) - 189650, and as a result, had found that a deposition film comprising Zn atoms, Se atoms and, at least, H atoms in which the H atoms are contained in the range of from 1 to 4 atomic % and the proportion of crystal grain domains per unit volume is from 65 to 85% by volume can be obtained by the HR-CVD process and the film can provide satisfactory results when used in the preparation of a photovoltaic device (the film is hereinafter simply referred to as: "ZnSe:H film").

However, the ZnSe:H film does not sufficiently absorb long wavelength light. Accordingly, an a-Si:H film or a-Si$_{1-x}$Ge$_x$:H film has to be used for the middle cell and/or bottom cell.

Also, since the ZnSe:H film described above has a refractive index n as low as 2.6 at a wavelength of 633 nm, the ratio of reflection at the interface with an a-Si:H film is relatively large, i.e. about 5%:

$$R = \left[ \frac{4.1 - 2.6}{4.1 + 2.6} \right]^2 = 0.050$$

Accordingly, it is understood that said film provides particularly remarkable effects when used as an antireflection layer.

In the same way, the present inventor had also studied ZnSeTe:H films, and as a result, had found the following.

That is, a mixed crystal type semiconductor film in which the composition ratio of the Se atoms and the Te atoms is in the range of from 1:9 to 3:7 in terms of the number of atoms, the H atoms are contained in an amount from 1 to 4 atomic % and the proportion of the crystal grain domains per unit volume is from 65 to 85 by volume (this film is hereinafter simply referred to as "ZnSe$_{1-x}$=Te$_x$:H film") is effective as an antireflection layer.

The foregoing facts have been confirmed as a result of the experiments described below.

Figure 7:
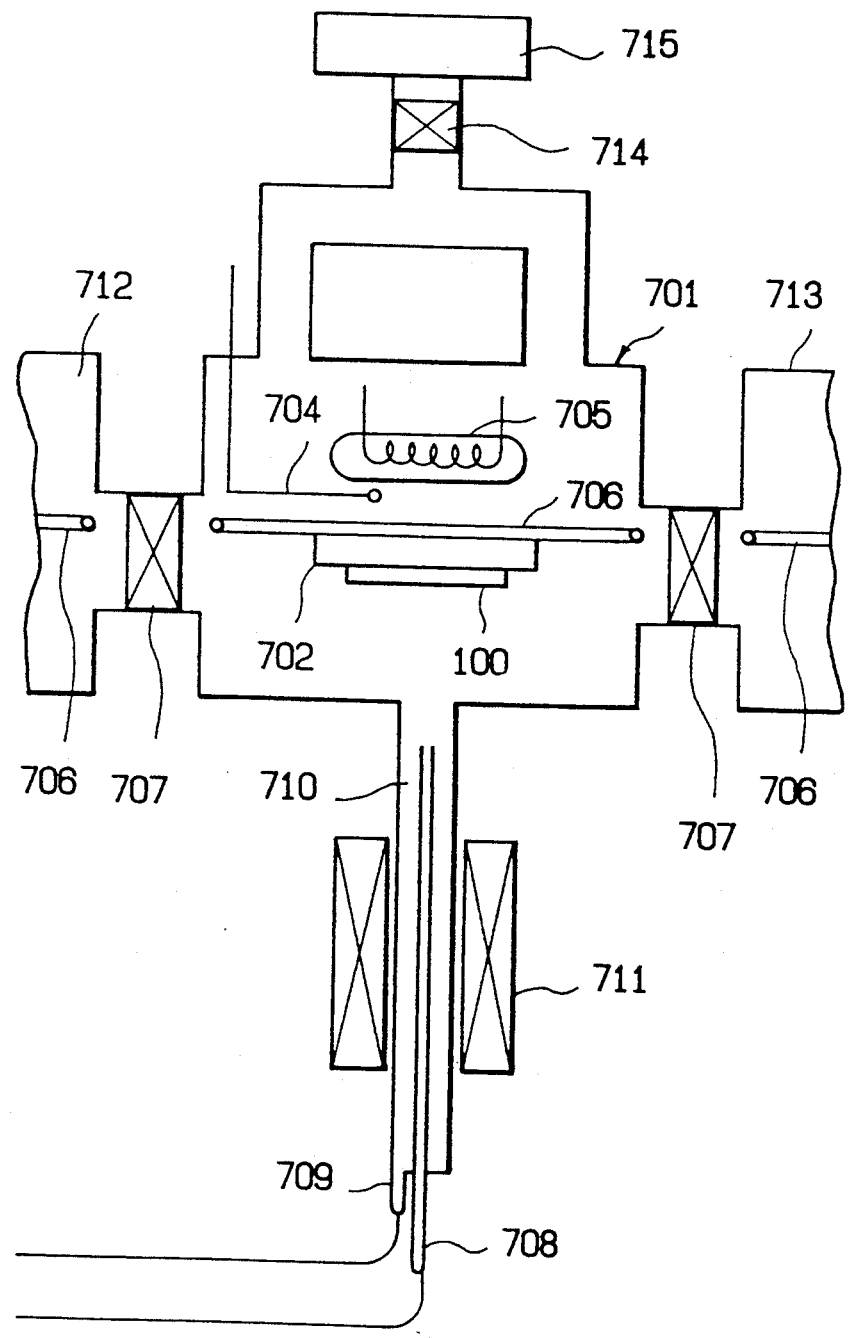
FIG. 7 is a schematic explanatory view for a HR-CVD film-forming apparatus used for preparing specimens in Experiments and Examples to be described later.

FIG. 7 shows a film-forming apparatus suitable for forming the ZnSe$_{1-x}$=Te$_x$:H film by the HR-CVD process.

In FIG. 7, there are shown a substrate 100, a film-forming chamber 701, a substrate holder 702, a temperature monitor 704, an electric heater (for example, infrared heater) 705, a substrate transport means 706, gate valves 707, gas feed pipes 708 and 709, an activation chamber 710, an activation means (for example, microwave applicator) 711, other film-forming chambers 712 and 713, an exhaust valve 714 and an exhaust pump 715.

This apparatus is one example of suitable apparatus for practicing the HR-CVD process.

A glass substrate 100 comprising a No. 7059 glass plate, manufactured by Corning Glass Works, was mounted on the substrate holder 702 and the inside of the film-forming chamber 701 was evacuated to bring the inner pressure to less than $10^{-5}$ Torr. Then, the substrate 100 was heated by the heater 705 to 200° C. and it was kept at this temperature. As the starting material gas (A), diethyl zinc (Zn(C$_2$H$_5$)$_2$, hereinafter referred to as "DEZn") was supplied through the gas feed pipe 708 at a flow rate of $1.0 \times 10^{-6}$ mol/min. Since DEZn is liquid at normal temperature, DEZn in a bottle (not illustrated) was bubbled with hydrogen gas and the resultant gas was supplied. Further, as another starting material gas (B), diethyl selenium (Se(C$_2$H$_5$)$_2$, hereinafter referred to as "DESe"), was supplied through the feed pipe 709, at a flow rate of $1.5 \times 10^{-5}$ mol/min. The hydrogen gas used for the bubbling was adjusted to 15 sccm in total. The inner pressure was maintained at about 0.5 Torr, and 200 W of microwave energy was applied through the activation means 711 to thereby deposit a ZnSe$_{1-x}$Te$_x$:H film of about 1 μm in thickness, whereby a specimen C-0 was prepared.

Further, a specimen C-1 was prepared in the same manner as for the specimen C-0 except for changing the flow rate for DESe in the starting material gas (B) to $3.0 \times 10^{-6}$ mol/min and the flow rate of diethyl tellurium (Te(C$_2$H$_5$)$_2$, hereinafter referred to as "DETe") to 8.0×10$^{-6}$ mol/min. For the thus obtained specimens C-0 and C-1, the refractive index n at a wavelength of 633 nm, the band gap Eg and the composition ratio x for Te were determined. The measurement results are shown in Table 7. From the results shown in Table 7, the following has been found. That is, the ZnSe$_{0.2}$Te$_{0.8}$:H film (n=3.05: specimen C-1) has an optimum refractive index as an antireflection layer at the interface between the a-Si:H film (n=4.0: specimen B-0) and the ZnSe:H film (n=2.6: specimen C-0). And the optimum thickness of the layer is 520 Å.

G. Preparation and Evaluation of Stacked Photovoltaic Device Using ZnSe:H Layer In this item, studies were made on a stacked photovoltaic device using a ZnSe:H film, an a-Si:H film and an a-Si$_{0.6}$Ge$_{0.4}$:H film in order to properly recognize the problems.

Figure 2:
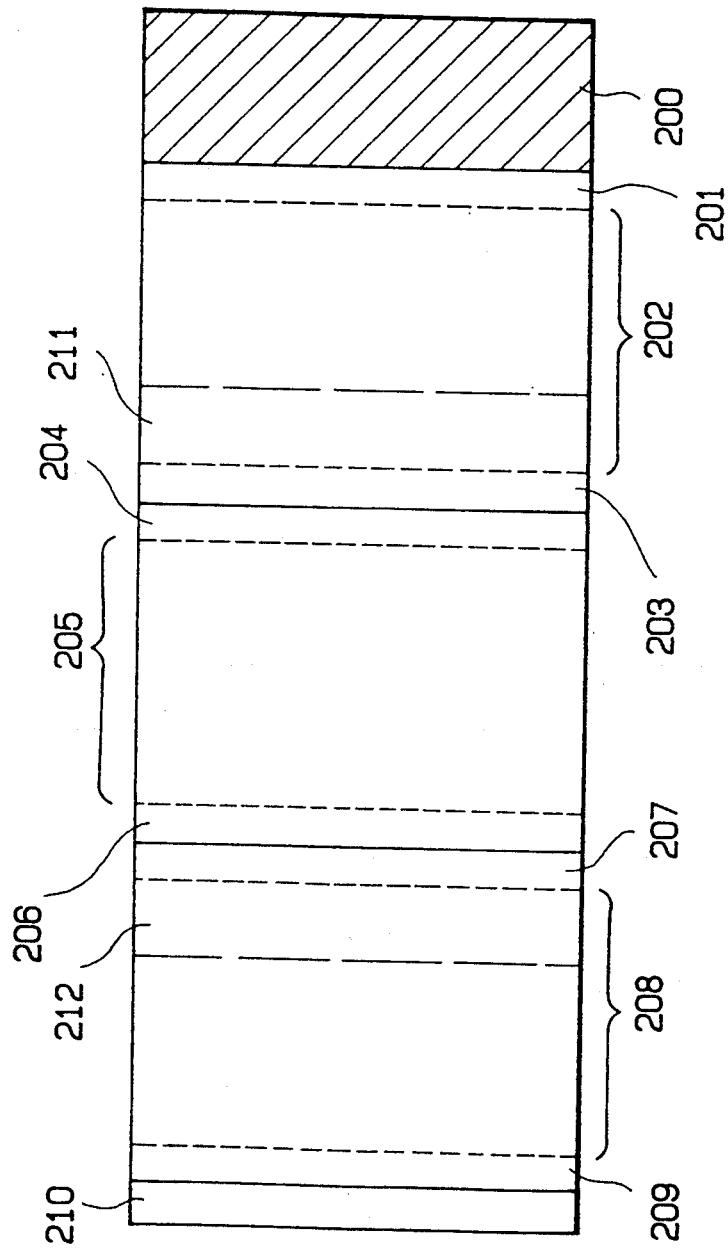
FIG. 2 is an embodiment of a stacked type photovoltaic device using a ZnSe:H series semiconductor layer for the top cell according to the present invention.

FIG. 2 shows the constitution of a photovoltaic device using a ZnSe:H film. A substrate 200 comprises a stainless steel plate. On the substrate 200, are successively provided a bottom cell comprising an n-type semiconductor 201 constituted with an n-type a-Si:H film, an i-type semiconductor layer 202 the main portion of which is comprised of a-Si$_{0.6}$Ge$_{0.4}$:H and a p-type semiconductor 203 constituted with a p-type a-Si:H film; a middle cell comprising an n-type semiconductor layer 204 constituted with an n-type a-Si:H film, an i-type semiconductor layer 205 constituted with an a-Si:H film and a p-type semiconductor layer 206 constituted with a p-type a-Si:H film; a top cell comprising an n-type Si:H film, an i-type semiconductor layer 208 the main portion of which is comprised of a ZnSe:H film, a p-type semiconductor layer 209 constituted with a p-type a-ZnSe:H film; and a transparent electrode 210 comprising an ITO film. The film thickness for each of the layers is shown in Table 9. Specimens for observing the effects of the antireflection layer of the top cell were prepared as shown in Table 8.

Specimen SC-5 is a photovoltaic device having the constitution and film thickness shown in Tables 8 and 9. Specimen SC-6 has no antireflection layer in the top cell, in which the thickness of the i-type layer was made identical with that of the i-type layer including the thickness of the antireflection layer of the specimen SC-5.

For each of the two specimens, the solar cell characteristics were evaluated by a solar simulator having a spectrum similar to AM-1 light. The measurement results for each of the specimens were as shown in Table 10.

From the results shown in Table 10, the effect of the antireflection layer in the top cell was recognized.

Description has been made of the stacked photovoltaic devices comprising three photovoltaic elements (cells) stacked as shown in FIG. 1 or FIG. 2 respectively in the case where light is impinged from the side of the upper electrode. However, the present invention is not restricted to the foregoing constitution but is effective also in those photovoltaic devices in which two or four or more photovoltaic elements (cells) are stacked or in which light is impinged through a transparent substrate.

Further, although description has been made of a photovoltaic device of a pin-type structure, the present invention is also applicable to a pn-type photovoltaic device having an interface between constituent semiconductor layers of different refractive index n.

The stacked photovoltaic device according to the present invention will be described specifically referring to the drawings.

The stacked photovoltaic device according to the present invention can be embodied, for example, as shown in FIG. 1 or FIG. 2. In FIG. 1 or FIG. 2, the substrate 100 or 200 may either be electroconductive or electrically insulative. The electroconductive substrate can include, for example, metals such as Fe, Ni, Cr, Al, Mo, Au, Nb, Ta, V, Ti, Pt and Pb or alloys thereof, such as brass or stainless steel. The electrically insulative substrate can include, for example, films or sheets of synthetic resins such as polyester, polyethylene, polycarbonate, cellulose acetate, polypropylene, polyvinyl chloride, polyvinylidene chloride, polystyrene, polyamide and polyimide, or glass, ceramic, etc. The substrate may be of any configuration such as plate-like, belt-like or cylindrical shape with smoothed or uneven surface depending on the purpose and the application use. The thickness of the substrate is selected so that a desired photovoltaic device can be provided. In the case where flexibility is required, it can be made as thin as possible within a range capable of sufficiently functioning as a substrate. However, the thickness of the substrate is usually greater than 10 μm in view of the fabrication and handling or mechanical strength of the substrate.

Further as the substrate 100 or 200, a single crystal or polycrystalline wafer made of Si, Ge, C, GaAs, GaP, InP, InSb, MgO, CaF$_2$, BaF$_2$, α-Al$_2$O$_3$, etc. may also be used.

In the case where the substrate 100, 200 is electroconductive, a semiconductor layer may be formed directly thereon. However, in the case where the substrate is electrically insulative, it is necessary to firstly form a lower electrode (not illustrated) thereon. Even in the case where the substrate is electroconductive, it is possible to provide said lower electrode in cases where necessary.

The lower electrode is constituted by a thin film of a metal such as Ag, Au, Pt, Ni, Cr, Cu, Al, Ti, Zn, Mo and W. The thin film may be formed by means of vacuum vapor deposition, electron beam vapor deposition, sputtering etc. The thus formed thin metal film is desired to be of a sheet resistance value, preferably, of not greater than 50 ohms and, more preferably, not greater than 10 ohms so that it does not constitute a resistive component to the photovoltaic device. Further, for reflecting light transmitted through the semiconductor layer and then passing the light again through the semiconductor layer, it is desired to have a reflection factor of the transmitted light of preferably more than 70% and more preferably, more than 90%. Furthermore, incident light can be utilized more efficiently by providing the lower electrode layer with minute irregularities so as to scatter the transmitted light, thereby efficiently scattering and reflecting the transmitted light to the semiconductor layer.

Furthermore, in the present invention, it is possible to provide a diffusion preventive layer comprising an electroconductive zinc oxide, etc. (not illustrated) on the substrate 100, 200 or the lower electrode. In this case, the constituent elements of the electrode can be prevented from diffusing into the semiconductor layer. Further, because of the diffusion preventive layer having an appropriate resistance, short-circuits caused by defects such as pinholes, etc. in the semiconductor layer can be prevented an improvement of the spectrum sensitivity of the photovoltaic device can be provided due to the multiple interfering effects of light in the zinc oxide layer.

It is necessary for the stacked photovoltaic device of the present invention to have an upper electrode 110 or 210. The upper electrode is desired to have a light transmission factor of 85% or more in order to efficiently absorb the incident light. And its sheet resistance is desired to be preferably less than 100 ohms and, more preferably, less than 50 ohms so that the internal resistance of the photovoltaic device is not increased.

As materials having such characteristics to constitute the upper electrode, there can be mentioned thin films (less than 100 Å) of metal oxides such as $SnO_2$, $In_2O_3$, ZnO, CO, $Cd_2SnO_4$, ITO ($In_2O_3 + SnO_2$), etc. or metals such as Au, Al or Cu. The foregoing thin film constituting the upper electrode can be formed by the conventional resistance heating vapor deposition method, electron beam vapor deposition method, sputtering method, spraying method, etc.

The thickness of the upper electrode is optimized so as to minimize the reflection caused by multiple interferences of the incident light.

Further, in the case where the sheet resistance of the upper electrode is not sufficiently low, a grid-like collector electrode (not illustrated) may further be disposed thereon so as to reduce the surface resistance. The grid-like collector electrode in this case is constituted by a thin film of metal such as Ag, Cr, Ni, Al, Au, Ti, Pt, Cu, Mo, W or an alloy thereof. In the case of disposing the foregoing collector electrode, it is designed such that the surface resistance is reduced efficiently with a minimum area.

The foregoing description is directed to the stacked photovoltaic device in which light is impinged from the side of the upper electrode 110 or 210. However, in the case where the substrate 100 or 200 is made of a transparent material such as glass, the stacked photovoltaic device can be used by impinging light from the side of the substrate 100 or 200. In this case, the lower electrode is constituted by the foregoing transparent electrode material and the upper electrode is constituted by the foregoing metal material having a high reflection factor.

The constitution of the constituent semiconductor layers for the stacked photovoltaic device according to the present invention may be properly designed by selectively using appropriate semiconductor films to satisfy the foregoing conditions to attain the object of the present invention.

Representative embodiments (Nos. 1 to 15) of said constitution are shown in Table 11.

The embodiment No. 1 shows an example of applying an antireflection layer according to the present invention with the constitution as shown in FIG. 1 to a stacked photovoltaic device in which the main portion of the i-type layer of the bottom cell ($i_1$-layer) comprises a-$Si_{1-x}Ge_x$:H, the main portion of the i-type layer of the middle cell ($i_2$-layer) comprises a-Si:H and the main portion of the i-type layer of the top cell ($i_3$-layer) comprises a-$Si_{1-y}C_y$:H. That is, an a-$Si_{1-x}Ge_x$:H film is inserted as the antireflection film 111 to the i-type layer of the bottom cell on the side of the p-type layer while adjusting the composition ratio x' for Ge such that the refractive index n for the a-$Si_{1-x}Ge_x$:H film corresponds to a geometrical mean of $\sqrt{na.nb}$ between the refractive index nb of the a-$Si_{1-x}Ge_x$:H film and the refractive index na of the a-Si:H film as the p-type layer and the film thickness corresponds to a value of $\lambda/4n$ in which $\lambda$ represents a central wavelength of light for which the reflection is inhibited. Further, an a-$Si_{1-y}C_y$:H film is inserted as the antireflection film 112 to the i-type layer of the middle cell on the side of the p-type layer while adjusting the composition ratio y' for the C such that the refractive index n for the a-$Si_{1-y}C_y$:H film corresponds to a geometrical mean of $\sqrt{na.nb}$ between the refractive index na of an a-$Si_{1-y}C_y$:H film as the p-type layer and the refractive index nb for the a-Si:H film the film thickness is $\lambda/4n$ in which $\lambda$ represents a central wavelength of light for which the reflection is inhibited.

Likewise, in Table 11, there are shown other examples of the stacked photovoltaic device according to the present invention (No. 2–No. 15) constituted by using semiconductor layers of appropriate element compositions depending on the refractive indexes of semiconductor layers adjacent to each other.

The elemental compositions of antireflection films usable in the present invention and formation process therefor are described below.

As the antireflection film in the present invention, there can be used thin films having specific physical properties (particularly, specific refractive index) determined by the constituent semiconductor films a and b adjacent to each other.

Examples of such thin film are amorphous semiconductor films such as a-$Si_{1-x}N_x$:H and a-$Si_{1-x}O_x$:H films ($0 < X < 1$) in addition to the foregoing a-$Si_{1-x}Ge_x$:H and a-$Si_{1-x}C_x$:H films; other non-single-crystal semiconductor films such as microcrystal ($\mu C$) $Si_{1-x}C_x$:H film ($0 < X < 1$); crystal type compound semiconductor films such as $CdSi_{1-x}Te_x$:H, $GaP_{1-x}As_x$:H and $Ga_{1-x}In_x$:P:H films ($0 < X < 1$) in addition to the foregoing ZnSe:H film and $ZnSe_{1-x}Te_x$:H film.

Any of the foregoing semiconductor films contains an appropriate amount of hydrogen atoms (H) for compensating re-combination centers which reduce the photovoltaic characteristics of the element. It may further contain fluorine atoms (F) having the same effect as H or contain both H and F. Examples of such films are, for example, as follows. That is, as the film containing F, there can be mentioned, for example, a-$Si_{1-x}Ge_x$:F, a-$Si_{1-x}$:F, a-$Si_{1-x}N_x$:F, a-$Si_{1-x}O_x$:F, $\mu C$-$Si_{1-x}C_x$:F, $ZnSe_{1-x}Te_x$:F, $CdS_{1-x}Te_x$:F, $GaP_{1-x}As_x$:F and $Ga_{1-x}In_x$:P:F films. As the film containing H and F, there can be mentioned, for example, a-$Si_{1-x}Ge_x$:H:F, a-$Si_{1-x}C_x$:H:F, a-$Si_{1-x}N_x$:H:F, a-$Si_{1-x}O_x$:H:F, $\mu C$-$Si_{1-x}C_x$:H:F, $ZnSe_{1-x}Te_x$:H:F, $CdS_{1-x}Te_x$:H:F, $GaP_{1-x}As_x$:H:F and $Ga_{1-x}In_x$:P:H:F films.

These films can be formed in the same manner as in the case of forming the foregoing semiconductor films for constituting other portions of the photovoltaic device according to the present invention. Typical processes for forming the semiconductor film to be the antireflection layer and the semiconductor films constituting other portions of the stacked photovoltaic device according to the present invention will be described.

(1) Glow Discharge Decomposing Method

In the glow discharge decomposing method, a hydride capable of supplying a constituent element for the resulting semiconductor film such as $SiH_4$ or a fluoride capable of supplying a constituent element for the resulting semiconductor film such as SiF is introduced into the film forming chamber 601 of the glow discharge film-forming apparatus as shown in FIG. 6 and decomposed by RF power applied to the cathode electrode 612 to thereby deposit a semiconductor film on the substrate 100. In this case, H or/and F is taken into the film to compensate the recombination centers.

Description will now be made of the starting material gas used upon forming various kinds of semiconductor films by the glow discharge decomposing method.

As the starting material gas for forming the a-Si:H film or $\mu$C-Si:H film (in which $\mu$C represents microcrystal), there can be mentioned, for example SiH$_4$, Si$_2$H$_6$, Si$_3$H$_8$ and (SiH$_2$)$_6$. The gas may be mixed with a dilution gas such as H$_2$, He, Ne, Ar, etc. As the starting material gas for forming a film of a-Si:F, a-Si:H:F, $\mu$C-Si:F or $\mu$C-Si:H:F, there can be mentioned, for example, SiF$_4$, Si$_2$F$_4$, SiHF$_3$, SiH$_2$F$_2$ or SiH$_3$F. The gas may be mixed with a dilution gas such as H$_2$, He, Ne or Ar. As the starting material gas for forming a-Si$_{1-x}$Ge$_x$:H film, there can be used gases used for forming the Si:H film and GeH$_4$ or Ge$_2$H$_6$. As the starting material gas for forming the a-Si$_{1-x}$Ge$_x$:F film or a-Si$_{1-x}$Ge$_x$:H:F film, there can be used the gases used for forming the a-Si:F film or a-Si:H:F film and GeH$_4$, Ge$_2$H$_6$ or GeF$_4$.

As the starting material gas for forming the a-Si$_{1-x}$C$_x$:H film or $\mu$C-Si$_{1-1}$C$_x$:H film, there can be used the gases used for forming the a-Si:H film and CH$_4$, C$_2$H$_6$, C$_3$H$_8$, C$_4$H$_{10}$, C$_2$H$_4$ or C$_2$H$_2$. As the starting material gases for forming the a-Si-$_{1-x}$C$_{1-x}$:F, $\mu$C-Si$_{1-x}$C$_x$:F, a-Si$_{1-x}$C$_x$:H:F films or $\mu$C-Si$_{1-x}$C$_x$:H:F films, there can be used the gases used for forming the a-Si:F or a-Si:H:F film and CH$_4$, C$_2$H$_6$, C$_3$H$_8$, C$_4$H$_{10}$, C$_2$H$_2$, CF$_4$, CFH$_3$, CFH$_2$H$_2$ or CF$_3$H. As the starting material gases for forming the a-Si$_{1-x}$N$_x$:H film, there can be used the gases used for forming the a-Si:H film and N$_2$ or NH$_3$. As the starting material gases for forming the a-Si$_{1-x}$N$_x$:F film or a-Si$_{1-x}$N$_x$:H film, there can be used the gases used for forming the a-Si:F or a-Si:H:F film and N$_2$, NH$_3$ or NF$_3$.

As the starting material gases for forming the a-Si$_{1-x}$O$_x$:H, there can be used the gases used for forming the a-Si$_{1-x}$:H film and O$_2$, O$_3$, H$_2$O, CO$_2$ or NO$_2$. As the starting material gases for forming the a-Si$_{1-x}$O$_x$:F film or a-Si$_{1-x}$O$_x$:H:F film, there can be used the gases used for forming the a-Si:F film or a-Si:H:F film and O$_2$, O$_3$, H$_2$O, CO$_2$ or NO$_2$.

As the starting material gases for forming the GaAs:H film, there can be used Ga(CH$_3$)$_3$, a gaseous mixture of Ga(CH$_3$)$_3$ or Ga(C$_2$H$_5$) and AsH$_3$. These gases may be mixed with a dilution gas such as H$_2$, He, Ne or Ar. As the starting material gases for forming the GaAs$_{1-x}$P$_x$:H film, there can be used the gases used for forming GaAs:H and PH$_3$. These gases may be mixed with a dilution gas such as H$_2$, He, Ne or Ar.

As the starting material gases for forming the Ga$_{1-x}$P$_x$:H film, there can be used Ga(CH$_2$)$_2$ or Ga(C$_2$H$_5$)$_3$; In(CH$_3$)$_3$ or In(C$_2$H$_5$)$_3$; and PH$_3$. These gases may be mixed with a dilution gas such as H$_2$, He, Ne or Ar. The typical film-forming conditions for forming the antireflection film and the semiconductor films constituting the other portions, of the stacked photovoltaic device according to the present invention are made by using these starting material gases, for example, as shown in Table 12.

(2) HR-CVD Process

In the HR-CVD process, a semiconductor thin film is deposited through a reaction of H radicals formed by applying an activation energy to a starting material gas (A) containing at least H, such as H$_2$, with active species produced by applying activation energy to a film-forming raw material gas (B) such as a halogenated compound containing a constituent element for the semiconductor film such as a halide e.g. SiF$_4$ or an organic metal compound e.g. Zn(CH$_3$)$_3$. As the apparatus used therefor, there may be used an apparatus of the constitution, for example, as shown in FIG. 7. In the case of using a halide as the starting material gas, halogen atoms (X) may sometimes be incorporated together with hydrogen atoms (H) in the resulting film. In the case where fluorine atoms are used as the halogen atoms (X), the fluorine atoms provide an effect of further compensating the re-combination level.

The starting material gas to be used in the HR-CVD process will be explained in the following.

As the starting material gas (A) for generating the hydrogen radicals, there may be used, generally, H$_2$ or, depending on the case SiH$_4$, Si$_2$H$_6$, GeH$_4$, CH$_4$, NH$_3$ or H$_2$O. In any case, there can be used a dilution gas such as He, Ne or Ar.

As the film-forming raw material gas (B) for forming the a-Si H, a-Si:H:F, $\mu$C-Si:H or $\mu$C-Si:H:F film, there may be used SiF$_4$, Si$_2$F$_4$, SiHF$_3$, SiH$_2$F$_2$, SiH$_3$F$_2$ or SiCl$_4$. Occasionally, depending on the reaction conditions, even though halogen (X) is contained in the starting material, no substantial halogen (X) is incorporated into the resulting film, thereby enabling formation of films substantially comprised of a-Si:H.

As the film-forming raw material gas (B) for forming the a-Si$_{1-x}$Ge$_x$:H or a-Si$_{1-x}$Ge:H:F film, there can be used the gas (B) used for forming the a-Si:H or a-Si:H:F, and GeF$_4$, Ge$_2$F$_4$ or GeCl$_4$.

As the film-forming raw material gas (B) for forming the a-Si$_{1-x}$C$_x$:H, a-Si$_{1-x}$C$_x$:H:F, $\mu$C-Si$_{1-x}$C$_x$:H or $\mu$C-Si$_{1-x}$C$_x$:H:F film, there can be used the gas (B) used for forming the a-Si:H or a-Si:H:F film and CF$_4$, CHF$_3$, CH$_2$F$_2$, CH$_3$F, CCl$_4$, CHCl$_3$, CH$_2$Cl$_2$ or CH$Cl$.

As the film-forming raw material gas (B) for forming the a-Si$_{1-x}$N$_x$:H or a-Si$_{1-x}$N$_x$:H:F film, NF$_3$ can be used in addition to the starting material gas (B) used for preforming the a-Si:H or a-Si:H:F film.

As the film-forming raw material gas (B) for forming the ZnSe:H film, there can be used Zn(CH$_3$)$_2$ or Zn(C$_2$H$_5$)$_2$ and Se(CH$_3$)$_2$, Se(C$_2$H$_5$)$_2$ or H$_2$Se.

As the film-forming raw material gas (B) for forming the ZnSe$_{1-x}$Te$_x$:H film, there can be used the starting material gas (B) used for forming the ZnSe:H film and Te(CH$_3$)$_2$ or Te(C$_2$H$_5$)$_2$.

As the film-forming raw material gas (B) for forming the GaAs:H film, there can be used Ga(CH$_3$): or Ga(C$_2$H$_5$)$_3$ and AsH$_3$.

As the film-forming raw material gas (B) for forming the GaAs$_{1-x}$P$_x$:H film, there can be used the gas (B) used for forming the GaAs:H film and PH$_3$ or PF$_5$.

As the film-forming raw material gas (B) for forming the Ga$_{1-x}$In$_x$:P:H film, there can be used Ga(CH$_3$)$_3$ or Ga(C$_2$H$_5$)$_3$; In(CH$_3$)$_3$ or In(C$_2$H$_5$); and PH$_3$.

The typical film-forming conditions for preparing the antireflection film and the semiconductor films constituting other portions of the stacked photovoltaic device according to the present invention by the HRCVD process and using the foregoing starting material gases are made, for example, as shown in Table 13.

(3) Reactive Sputtering Method

The reactive sputtering method (generally called "sputtering method" in short) is a method of applying RF power to a target containing constituent elements of a semiconductor film to be formed in an atmosphere containing rare gas such as He, Ne, Ar or Xe and bombarding the target with ions generated from said rare gas to generate atoms constituting a semiconductor film, thereby causing the formation of a desired semiconductor film on the substrate opposed to the target.

Figure 8:
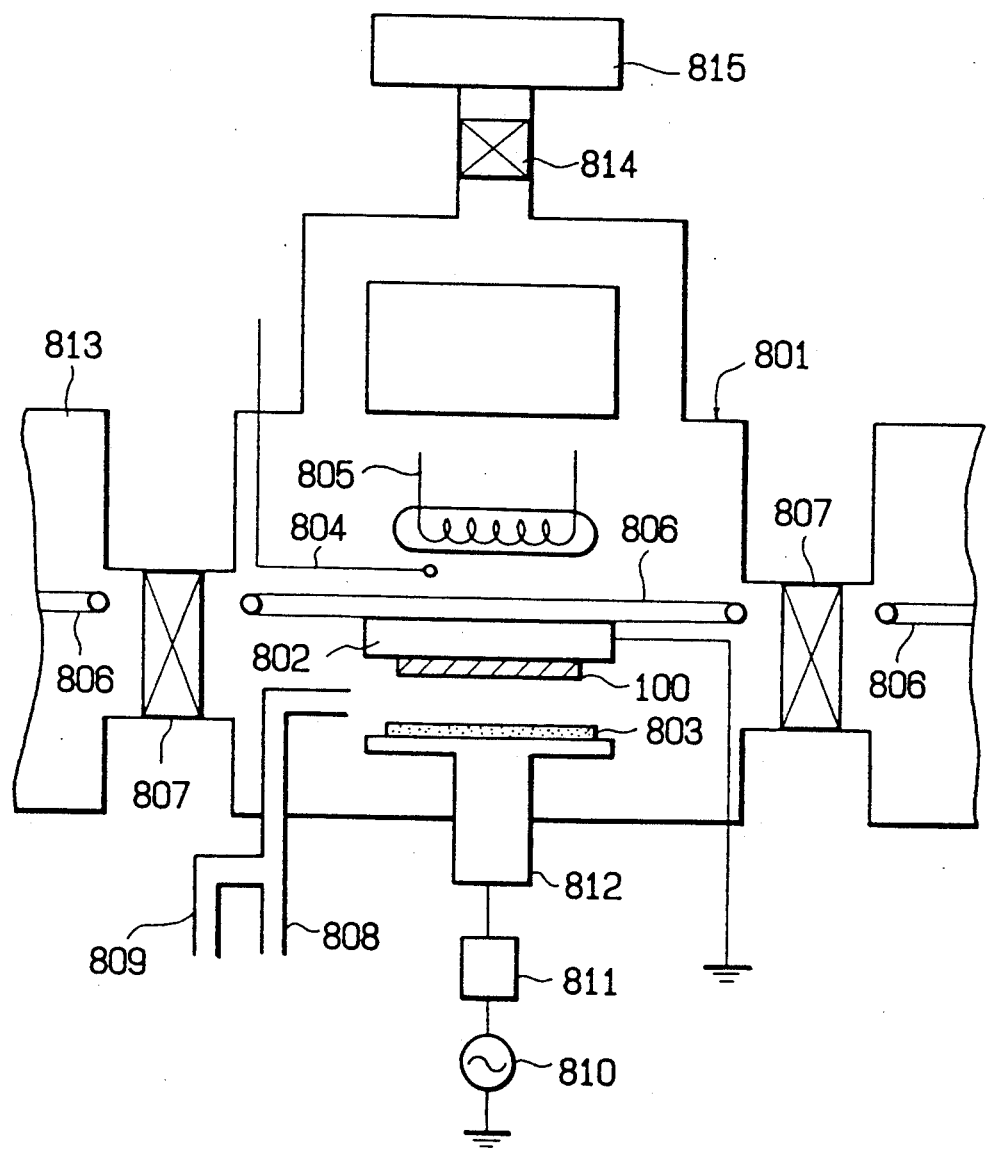
FIG. 8 is a schematic explanatory view for a reactive sputtering film-forming apparatus used for preparing specimens in Experiments and Examples to be described later.

According to this sputtering method, H or F can be incorporated into the resulting semiconductor film, particularly, by adding $H_2$, $SiH_4$, $F_2$ or $SiF_4$. in addition to the rare gas. FIG. 8 shows an example of the apparatus suitable for practicing the reactive sputtering method. In FIG. 8, there are shown a film-forming chamber 801, a substrate 100, a substrate holder 802, a target 803, a temperature monitor 804, an electric heater 805, a substrate transport means 806, gate valves 807, gas feed pipes 808 and 809, a RF power source 810, a matching circuit 811, a cathode electrode 812, another film-forming chamber 813, an exhaust valve 814, and an exhaust pump 815, respectively.

The apparatus is merely one example of apparatus suitable for practicing the reactive sputtering method.

Description will now be made of forming an a-Si:H film as one example. There is used a single crystal of silicon as the target 803. A substrate 100 comprising a No. 7059 glass plate, manufactured by Corning Glass Works, is secured to the substrate holder 802 and then the inside of the film-forming chamber is evacuated to about $10^{-5}$ Torr.

Then, the substrate 100 is heated by the electric heater 805 to 250° C. and it is kept at this temperature. Then, Ar gas and $H_2$ gas are introduced at respective flow rates of 10 sccm and 1 sccm through the gas feed pipes 808 and 809 respectively. The inner pressure is adjusted to less than 5 mm Torr by regulating the exhaust valve 814. Then, RF power of 300 W is applied. After about one hour, 1 μm of a-Si:H film is deposited.

Upon forming a semiconductor film containing a plurality of constituent elements in addition to H or F, such as an a-Si$_{1-x}$Ge$_x$:H film or GaAs:H film, there may be used a target composed of the corresponding constituent elements. It is also possible to use a target comprising a plurality of small wafer pieces of Ge on a Si target and partitioning the surface of the target at a predetermined ratio of Si and Ge.

The typical film-forming conditions for forming the antireflection film and semiconductor films constituting other portions of the stacked photovoltaic device according to the present invention by means of the reactive sputtering method are made, for example, as shown in Table 14.

DESCRIPTION OF THE PREFERRED EMBODIMENTS

This invention will be described more specifically while referring to the following examples, but the invention is not intended to limit the scope only to these examples.

Example 1 and Comparative Example 1

EXAMPLE 1

A stacked photovoltaic device of the configuration shown in FIG. 1 was manufactured by the glow discharge decomposition method, using the capacitive coupled glow discharge film-forming apparatus shown in FIG. 6.

A stainless steel substrate 100 of 50 mm×50 mm in size was mounted on the anode electrode 602 and then the film-forming chamber 601 was evacuated to control the inner pressure to less that $10^{-5}$ Torr. Then, the heater 605 was actuated to heat the substrate 100 to 250° C. and it was maintained at this temperature. SiH$_4$ gas, H$_2$ gas, PH$_3$ gas (diluted with H$_2$ gas to 1% concentration) were introduced at respective flow rates of 30 sccm, 40 sccm and 10 sccm into the film-forming chamber 601. Then, the inner pressure of the film-forming chamber 601 was controlled to about 0.5 Torr, and RF power of 50 W was applied to effect discharge. After 3 minutes, there was formed an n-type a-Si:H film 101. Subsequently, after suspending the application of RF power and the introduction of the gases, the inside of the film-forming chamber 601 was evacuated to less than $10^{-5}$ Torr. Successively, SiH$_4$ gas, GeH$_4$ gas and H$_2$ gas were introduced at respective flow rates of 30 sccm, 4 sccm and 40 sccm into the film-forming chamber 601 and discharge was effected under the conditions of about 0.5 Torr pressure and 50 W RF power applied for 42 minutes. Then, the flow rate of the GeH$_4$ gas was changed to 1.2 sccm and discharge was continued for 8 minutes. In this way, there were continuously formed an i-type a-Si$_{0.4}$Ge$_{0.4}$:H film 102 and an i-type a-Si$_{0.86}$Ge$_{0.14}$:H film 111 as an antireflection layer. Then, after evacuating again, SiH$_4$ gas, H$_2$ gas and B$_2$H$_6$ gas (diluted with H$_2$ gas to 1% concentration) were introduced at respective flow rates of 30 sccm, 40 sccm and 10 sccm into the film-forming chamber 601 and discharge was conducted under the conditions of about 0.5 Torr pressure and 50 W RF power to thereby form a p-type a-Si:H film 103.

Then, an n-type a-Si:H film 104 was formed under the same conditions as those for forming the foregoing film 101. Thereafter, SiH$_4$ gas and H$_2$ gas were introduced at respective flow rates of 30 sccm and 40 sccm into the film-forming chamber 601 discharge was conducted under the conditions of about 0.5 Torr pressure 50 W RF power. This process was continued for 60 minutes. Next, CH$_4$ gas was added at a flow rate of 6.5 sccm in addition to the SiH$_4$ gas and the H$_2$ gas and discharge was continued for 5 minutes with RF power of 100 W. In this way, there were continuously formed an i-type a-Si:H film 105 and i-type a-Si$_{0.87}$C$_{0.13}$:H film 112 as an antireflection layer. Then, SiH$_4$ gas, CH$_4$ gas and H$_2$ gas, B$_2$H$_4$ gas (diluted with H$_2$ gas to 1% concentration) were introduced at respective flow rates of 30 sccm, 15 sccm, 40 sccm and 10 sccm and discharge was performed for 3 minutes under the conditions of about 0.5 Torr pressure and 100 W RF power to thereby form a p-type a-Si$_{0.7}$C$_{0.3}$:H film 106. Thereafter, discharge was conducted for 3 minutes under the same conditions as above except for introducing 10 sccm of PH$_3$ gas (diluted with H$_2$ gas to 1% concentration) instead of the foregoing B$_2$H$_6$ gas to thereby form an n-type a-Si$_{0.7}$C$_{0.3}$:H film 107. Then, after thoroughly evacuating the inside of the film-forming chamber 601, SiH$_4$ gas, CH$_4$ gas and H$_2$ gas were introduced into the film-forming chamber 601 at respective flow rates of 30 sccm, 15 sccm and 10 sccm and discharge was conducted for 25 minutes under the conditions of about 0.5 Torr pressure and 100 W RF power to thereby form an i-type a-Si$_{0.7}$C$_{0.03}$:H film 108.

Then, a p-type a-Si$_{0.7}$C$_{0.3}$:H film 109 was formed by repeating for 2 minutes the foregoing film-forming procedures for forming the film 106.

After completing the film-formation, the electric heater 605 was disconnected and the resultant specimen was allowed to cool. The cooled specimen was taken out from the glow discharge film-forming apparatus and placed in a conventional resistance heating vacuum vapor deposition apparatus to form a transparent ITO electrode 110 by heating In and Sn in an alumina crucible under an oxygen atmosphere. In this way, a stacked photovoltaic device of the present invention having the configuration shown in FIG. 1 was obtained.

Comparative Example 1

For comparison purposes, a stacked photovoltaic device of the configuration with no antireflection layer as shown in FIG. 3 was prepared by the glow discharge decomposition method in the same manner as in Example 1, using the capacitive coupled glow discharge film-forming apparatus shown in FIG. 6.

As in Example 1, after mounting a stainless steel plate of 50 mm×50 mm in size as the substrate 300 (FIG. 3) to the anode electrode 602 of the apparatus, the film-forming chamber 601 was evacuated to less than $10^{-5}$ Torr. The temperature of the substrate was maintained at 250° C. Then, $SiH_4$ gas, $H_2$ gas and $PH_3$ gas (diluted with $H_2$ gas to 1% concentration) were introduced into the film-forming chamber 601 at respective flow rates of 30 sccm, 40 sccm and 10 sccm. Then, the pressure of the film-forming chamber 601 was kept at about 0.5 Torr and RF power of 50 W was applied to cause discharge. After 3 minutes, there was formed an n-type a-Si:H film 301. Then, the application of the RF power and the introduction of the gases were suspended. The film-forming chamber 601 was evacuated to less than $10^{-5}$ Torr. Then, $SiH_4$ gas, $GeH_4$ gas and $H_2$ gas were introduced into the film-forming chamber 601 at respective flow rates of 30 sccm, 4 sccm and 40 sccm. Discharge was caused under the conditions of about 0.5 Torr pressure and 50 W RF power. After 50 minutes, there was formed an i-type a-$Si_{0.6}Ge_{0.4}$:H film 302.

Thereafter, the film-forming chamber 601 was evacuated again to less than $10^{-5}$ Torr. $SiH_4$ gas, $H_2$ gas and $B_2H_6$ gas (diluted with $H_2$ gas to 1% concentration) were then introduced into the film-forming chamber 601 at respective flow rates of 30 sccm, 40 sccm and 10 sccm. After controlling the inner pressure to about 0.5 Torr, RF power of 50 W was applied to cause discharge. After the discharge was continued for 3 minutes, there was formed a p-type a-Si:H film 303. Successively, there was formed an n-type a-Si:H film 304 under the same conditions as those for forming the film 301. Thereafter, $SiH_4$ gas and $H_2$ gas were introduced into the film-forming chamber 601 at respective flow rates of 30 sccm and 40 sccm. Discharge was caused under the conditions of about 0.5 Torr pressure and 50 W RF power. After the discharge was continued for 65 minutes, there was formed an i-type a-Si:H film 305. Then, $SiH_4$ gas, $CH_4$ gas, $H_2$ gas and $B_2H_6$ gas diluted with $H_2$ gas to 1% concentration ($B_2H_6/H_2=1\%$) were introduced into the film-forming chamber 601 at respective flow rates of 30 sccm, 15 sccm, 40 sccm and 10 sccm and discharge was caused under the conditions of about 0.5 Torr pressure and 100 W RF power. After the discharge was continued for 3 minutes, there was formed a p-type a-$Si_{0.7}C_{0.3}$:H film 306. Then, an n-type a-$Si_{0.7}C_{0.3}$:H film 307 was formed under the same conditions as those described above except for introducing $PH_3$ gas diluted with $H_2$ ($PH_3/H_2=1\%$) instead of the foregoing $B_2H_4$ gas. Subsequently, $SiH_4$ gas, $CH_4$ gas and $H_2$ gas were introduced into the film-forming chamber 601 at respective flow rates of 30 sccm, 15 sccm and 10 sccm and discharge was conducted for 25 minutes to thereby from an i-type a-$Si_{0.7}C_{0.3}$:H film 308. Then, a p-type a-$Si_{0.7}C_{0.3}$:H film 309 was formed by repeating the same film-forming procedures for forming the film 306 for 2 minutes. Subsequently, a transparent ITO electrode 310 was formed in the same manner as in Example 1.

In this way, there was prepared a conventional stacked photovoltaic device having the configuration shown in FIG. 3 having no antireflection film.

EVALUATIONS

Each of the stacked photovoltaic devices obtained in Example 1 (hereinafter referred to as "Specimen No. 1") and the stacked photovoltaic device obtained in Comparative Example 1 (hereinafter referred to as "Comparative Specimen No. 1") was evaluated by a solar simulator having spectra similar to AM-1 light. As a result, it has been found that the Specimen No. 1 had an Isc of 7.6 mA/$cm^2$ and a photoelectric conversion efficiency of 12.8%. On the other hand, it has been found that the Comparative Specimen No. 1 had a Isc of 6.5 mA/$cm^2$ and a photoelectric conversion efficiency of 10.6%. From these results, it has been recognized that since the stacked photovoltaic device according to the present invention has a specific antireflection layer, photocurrent is increased and the photoelectric conversion efficiency is improved.

Example 2 and Comparative Example 2

EXAMPLE 2

A stacked photovoltaic device of the configuration shown in FIG. 2 was prepared by using the capacitive coupled glow discharge film-forming apparatus shown in FIG. 6 and the HR-CVD film-forming apparatus shown in FIG. 7.

A stainless steel plate of 50 mm×50 mm in size was used as the substrate 200.

Firstly, in the same way as in Example 1, there were successively formed an n-type a-Si:H film 201, an i-type a-$Si_{0.6}Ga_{0.4}$:H film 202, an i-type a-$Si_{0.86}Ga_{0.14}$:H film 211 as an antireflection layer, a p-type a-Si:H film 203 and an n-type a-Si:H film 204 on the substrate 200.

Then, there was formed an i-type a-Si:H film 205 by repeating the procedures for the formation of the i-type layer 105 in Example 1 for 65 minutes. Thereafter, there was formed a p-type a-Si:H film 206 under the same conditions as those for forming the p-type a-Si:H film 103 in Example 1. Further, there was formed an n-type a-Si:H film 207 under the same conditions as those for forming the n-type a-Si:H film 104 in Example 1.

Then, the film-forming chamber 601 of the apparatus shown in FIG. 6 was evacuated, and the substrate 200 having a plurality of the semiconductor films laminated thereon was transported through the gate valve 607 to a predetermined position in the film-forming chamber 701 of the HR-CVD film-forming apparatus shown in FIG. 7. In this case, the substrate 200 (substrate 100 in FIG. 7) was fixed to the substrate holder 702 such that the stacked semiconductor layers are faced downward as shown in FIG. 7.

The substrate was heated to 200° C. and maintained at this temperature by means of the infrared heater 705 while monitoring with the temperature monitor 704. Diethyl zinc (DEZn) was introduced as the starting material gas (A) into the film-forming chamber 701 at a flow rate of $1.0\times10^{-6}$ mol/min through the gas feed pipe 708. Since DEZn is liquid at normal temperature, it was bubbled with $H_2$ gas in a bubbling vessel (not shown) while introducing said $H_2$ gas at a flow rate of 10 sccm thereinto to thereby gasify the DEZn. Separately, diethyl selenium (DESe) and diethyl tellurium (DETe) as the starting material gases (B) were introduced into the film-forming chamber 701 at respective flow rates of $3.0 \times 10^{-6}$ mol/min and $8.0 \times 10^{-6}$ mol/min through the gas feed pipe 709.

Said DESe and DETe were gasified in the similar manner to the case of the DEZn wherein He gas and $H_2$ gas were fed into a bubbling vessel (not shown) at respective flow rates of 5 sccm and 15 sccm.

The opening of the exhaust valve 714 was adjusted to maintain the pressure in the film-forming chamber 701 at about 0.5 Torr. Then, microwave energy (2.45 GHz) of 200 W was applied through the activation means 711 into the activation chamber 710. After 5 minutes, there was formed a $ZnSe_{0.2}Te_{0.8}$:H film 212 as an antireflection layer. The foregoing film-forming procedures were repeated, except for not using the DETe and changing the flow rate of the DESe to $1.5 \times 10^{-5}$ mol/min, to thereby form a ZnSe:H film 208 as the i-type semiconductor layer after 35 minutes. Then the foregoing film-forming procedures were repeated, except for adding $LiC_3H_7$ as a p-type dopant to the starting material gas (A) at a flow rate of $1.0 \times 10^{-9}$ mol/min, to thereby form a ZnSe:H:Li film 209 as the p-type semiconductor layer after 2 minutes. After cooling the resultant specimen, a transparent electrode 210 was formed on the specimen in the same manner as in Example 1.

Thus, a stacked photovoltaic device according to the present invention having the configuration shown in FIG. 2 was obtained.

COMPARATIVE EXAMPLE 2

For comparison purposes, a stacked photovoltaic device having the configuration with no antireflection layer as shown in FIG. 3 was prepared by using the capacitive coupled glow discharge film-forming apparatus shown in FIG. 6 and the HR-CVD film-forming apparatus shown in FIG. 7.

A stainless steel substrate of 50 mm × 50 mm in size was used as the substrate 300 (FIG. 3).

Semiconductor films 301, 302, 303, 304 and 305 were successively formed on the substrate 300 in the same manner as in Comparative Example 1 in which the apparatus shown in FIG. 6 was used. Then, a p-type a-Si:H film 306 was formed in the same manner as that for forming the semiconductor film 303 in Comparative Example 1. Thereafter an n-type a-Si:H film 307 was formed in the same manner as that for forming the semiconductor film 304 in Comparative Example 1. Then, the film-forming chamber 601 of the apparatus shown in FIG. 6 was evacuated and the substrate 300 having a plurality of semiconductor films laminated thereon was transported through the gate valve 607 to a predetermined position in the film-forming chamber 701 of the HR-CVD film-forming apparatus shown in FIG. 7. In this case, the substrate 300 (100 in FIG. 7) was fixed to the substrate holder 702 with the stacked semiconductor films being faced downward as shown in FIG. 7. Then, in the same manner as in Example 2, the substrate temperature was maintained at 200° C. and DEZn was introduced as the starting material gas (A) at a flow rate of $1.0 \times 10^{-6}$ mol/min through the gas feed pipe 708, and DESe as the starting material gas (B) was introduced at a flow rate of $1.5 \times 10^{-5}$ mol/min through the gas feed pipe 709. The inner pressure of the film-forming chamber 701 was maintained at about 0.5 Torr. A microwave energy of 200 W was applied into the activation chamber 710. After 40 minutes, there was formed an i-type ZnSe:H film 308. Then, a p-type ZnSe:H:Li film 309 was formed under the same film-forming conditions as those described above except for adding $LiC_3H_7$, as a p-type dopant at a flow rate of $1.0 \times 10^{-9}$ mol/min to the starting material gas (A). Then, a transparent electrode 310 was formed in the same manner as in Example 1. Thus, there was obtained a conventional stacked photovoltaic device having the configuration shown in FIG. 3 which does not have any antireflection layer.

EVALUATIONS The stacked photovoltaic device obtained in Example 2 (hereinafter referred to as "Specimen No. 2") and the stacked photovoltaic device obtained in Comparative Example 2 (hereinafter referred to as "Comparative Specimen No. 2") were evaluated by a solar simulator having spectra similar to AM-1 light. As a result, it was found that the Specimen No. 2 had a Isc of 7.2 mA/cm$^2$ and a photoelectric conversion efficiency of 13.2% On the other hand, it has been found that the Comparative Specimen No. 2 had a Isc of 6.4 mA/cm$^2$ and a photoelectric conversion efficiency of 10.8%. From these results, it has been recognized that since the stacked photovoltaic device according to the present invention has a specific antireflection film, photocurrent is increased and the photoelectric conversion efficiency is remarkably improved.

TABLE 1

| Sample No. | composition ratio of Ge (x) | refractive index (n) | band gap (Eg) |
|---|---|---|---|
| A-0 | 0.00 | 3.6 | 1.70 |
| A-1 | 0.09 | 4.0 | 1.63 |
| A-2 | 0.14 | 4.2 | 1.60 |
| A-3 | 0.28 | 4.6 | 1.50 |
| A-4 | 0.40 | 5.0 | 1.40 |

TABLE 2

| Sample No. | composition ratio of C (x) | refractive index (n) | band gap (Eg) |
|---|---|---|---|
| B-0 | 0.00 | 4.0 | 1.70 |
| B-1 | 0.09 | 3.5 | 1.80 |
| B-2 | 0.13 | 3.3 | 1.84 |
| B-3 | 0.20 | 3.0 | 1.90 |
| B-4 | 0.30 | 2.7 | 2.00 |

TABLE 3

| photovoltaic element | conduction type of the constituent semiconductor layer (reference numeral in FIG. 3) | constituent semiconductor film | Eg | n ($\lambda = $ 633 nm) | n ($\lambda = $ 751 nm) |
|---|---|---|---|---|---|
| Top Cell | p (309) | a-Si$_{0.7}$C$_{0.3}$:H | 2.0 | 2.7 | |
| | i (308) | | | | |
| | n (307) | | | | |
| Middle Cell | p (306) | a-Si:H | 1.7 | 4.0 | 3.6 |
| | i (305) | | | | |
| | n (304) | | | | |
| Bottom Cell | p (303) | a-Si$_{0.6}$Ge$_{0.4}$:H | 1.4 | | 5.0 |
| | i (302) | | | | |

TABLE 3-continued

| photovoltaic element | conduction type of the constituent semiconductor layer (reference numeral in FIG. 3) | constituent semiconductor film | Eg | n $\lambda=$ 633 nm | $\lambda=$ 751 nm |
|---|---|---|---|---|---|
| | n (301) | | | | |

TABLE 4

| reference numeral in FIG. 1 | conduction type of the constituent semiconductor layer | constituent semiconductor film | layer thickness (nm) |
|---|---|---|---|
| 109 | $p^+$ | a-Si$_{0.7}$C$_{0.3}$ | 8 |
| 108 | i | a-Si$_{0.7}$C$_{0.3}$ | 400 |
| 107 | $n^+$ | a-Si$_{0.7}$C$_{0.3}$ | 15 |
| 106 | $p^+$ | a-Si$_{0.7}$C$_{0.3}$ | 15 |
| 112 | i | a-Si$_{0.87}$C$_{0.13}$ | 48 |
| the remaining part of 105 | i | a-Si | 450 |
| 104 | $n^+$ | a-Si | 15 |
| 103 | $p^+$ | a-Si | 15 |
| 111 | i | a-Si$_{0.86}$Ge$_{0.14}$ | 45 |
| the remaining part of 102 | i | a-Si$_{0.6}$Ge$_{0.4}$ | 250 |
| 101 | $n^+$ | a-Si | 20 |

TABLE 5

| Sample No. | Middle Cell | Bottom Cell |
|---|---|---|
| SC-1 | reflection preventive layer: present | reflection preventive layer: present |
| SC-2 | reflection preventive layer: not present | reflection preventive layer: present |
| SC-3 | reflection preventive layer: present | reflection preventive layer: not present |
| SC-4 | reflection preventive layer: not present | reflection preventive layer: not present |

TABLE 6

| Sample No. | short-circuit photocurrent Isc (mA/cm$^2$) | photoelectric conversion efficiency $\eta$ (%) |
|---|---|---|
| SC-1 | 7.4 | 12.5 |
| SC-2 | 6.9 | 11.4 |
| SC-3 | 7.1 | 11.6 |

TABLE 6-continued

| Sample No. | short-circuit photocurrent Isc (mA/cm$^2$) | photoelectric conversion efficiency $\eta$ (%) |
|---|---|---|
| SC-4 | 6.5 | 10.5 |

TABLE 7

| Sample No. | composition ratio of Te (x) | refractive index (n) | band gap (Eg) |
|---|---|---|---|
| C-0 | 0.00 | 2.6 | 2.67 |
| C-1 | 0.80 | 3.05 | 2.30 |
| (reference) B-0 | — | 4.0 | 1.70 |

TABLE 8

| Sample No. | Top Cell | Bottom Cell |
|---|---|---|
| SC-5 | reflection preventive layer: present | reflection preventive layer: present |
| SC-6 | reflection preventive layer: not present | reflection preventive layer: present |

TABLE 9

| reference numeral in FIG. 2 | conduction type of the constituent semiconductor layer | constituent semiconductor film | layer thickness (nm) |
|---|---|---|---|
| 209 | $p^+$ | ZnSe:H | 10 |
| the remaining part of 208 | i | ZnSe:H | 900 |
| 212 | i | ZnSe$_{0.2}$Te$_{0.8}$:H | 52 |
| 207 | $n^+$ | a-Si:H | 10 |
| 206 | $p^+$ | a-Si:H | 10 |
| 205 | i | a-Si:H | 450 |
| 204 | $n^+$ | a-Si:H | 15 |
| 203 | $p^+$ | a-Si:H | 15 |
| 211 | i | a-Si$_{0.86}$Ge$_{0.14}$:H | 45 |
| the remaining part of 202 | i | a-Si$_{0.6}$Ge$_{0.4}$:H | 250 |
| 201 | $n^+$ | a-Si:H | 20 |

TABLE 10

| Sample No. | short-circuit photocurrent Isc (mA/cm$^2$) | photoelectric conversion efficiency $\eta$ (%) |
|---|---|---|
| SC-5 | 7.0 | 13.1 |
| SC-6 | 6.3 | 11.9 |

TABLE 11

| reference numeral in FIG. 1 | conduction type of the constituent semiconductor layer | No. 1 | No. 2 | No. 3 | No. 4 | No. 5 | No. 6 |
|---|---|---|---|---|---|---|---|
| 109 | $p^+$ | a-Si$_{1-y}$C$_y$:H | a-Si$_{1-y}$C$_y$:H | a-Si$_{1-y}$C$_y$:H | a-Si$_{1-y}$C$_y$:H | a-Si$_{1-y}$C$_y$:H | a-Si$_{1-y}$C$_y$:H |
| 108 | i | a-Si$_{1-y}$C$_y$:H | a-Si$_{1-y}$C$_y$:H | a-Si$_{1-y}$C$_y$:H | a-Si$_{1-y}$C$_y$:H | a-Si$_{1-y}$C$_y$:H | a-Si$_{1-y}$C$_y$:H |
| 107 | $n^+$ | a-Si$_{1-y}$C$_y$:H | a-Si$_{1-y}$C$_y$:H | a-Si$_{1-y}$C$_y$:H | a-Si$_{1-y}$C$_y$:H | a-Si$_{1-y}$C$_y$:H | a-Si$_{1-y}$C$_y$:H |
| 106 | $p^+$ | a-Si$_{1-y}$C$_y$:H | a-Si$_{1-y}$C$_y$:H | a-Si$_{1-y}$C$_y$:H | a-Si$_{1-y}$C$_y$:H | a-Si$_{1-y}$C$_y$:H | a-Si$_{1-y}$C$_y$:H |
| 112 | i | a-Si$_{1-y'}$C$_{y'}$:H | a-Si$_{1-y'}$N$_{y'}$:H | a-Si$_{1-y'}$C$_{y'}$:H | a-Si$_{1-y'}$N$_{y'}$:H | a-Si$_{1-y'}$C$_{y'}$:H | a-Si$_{1-y'}$N$_{y'}$:H |
| the remaining part of 105 | i | a-Si:H | a-Si:H | a-Si:H | a-Si:H | a-Si:H | a-Si:H |
| 104 | $n^+$ | a-Si:H | a-Si:H | a-Si:H | a-Si:H | a-Si:H | a-Si:H |
| 103 | $p^+$ | a-Si:H | a-Si:H | a-Si:H | a-Si:H | a-Si:H | a-Si:H |
| 111 | i | a-Si$_{1-x'}$Ge$_{x'}$:H | a-Si$_{1-x'}$Ge$_{x'}$:H | GaAs$_{1-x'}$P$_{x'}$:H | GaAs$_{1-x'}$P$_{x'}$:H | Ga$_{1-x'}$In$_{x'}$As:H | Ga$_{1-x'}$In$_{x'}$As:H |
| the remaining part of 102 | i | a-Si$_{1-x}$Ge$_x$:H | a-Si$_{1-x}$Ge$_x$:H | GaAs:H | GaAs:H | GaAs:H | GaAs:H |
| 101 | $n^+$ | a-Si:H | a-Si:H | GaAs:H | GaAs:H | GaAs:H | GaAs:H |

| reference numeral in FIG. 2 | conduction type of the constituent semiconductor layer | No. 7 | No. 8 | No. 9 | No. 10 | No. 11 |
|---|---|---|---|---|---|---|
| 209 | $p^+$ | a-Si$_{1-y}$C$_y$:H | ZnSe:H | a-Si$_{1-z}$C$_z$:H | a-Si$_{1-y}$C$_y$:H | ZnSe:H |

TABLE 11-continued

| reference numeral in FIG. 2 | conduction type of the constituent semiconductor layer | No. 7 | No. 8 | No. 9 | No. 10 | No. 11 |
|---|---|---|---|---|---|---|
| the remaining part of 208 | i | a-Si$_{1-y}$C$_y$:H | ZnSe:H | CdS:H | a-Si$_{1-y}$C$_y$:H | ZnSe:H |
| 212 | i | a-Si$_{1-y}$C$_y$:H | ZnSe$_{1-y'}$Te$_{y'}$:H | CdS$_{1-y'}$Te$_{y'}$:H | a-Si$_{1-y}$C$_y$:H | ZnSe$_{1-y'}$Te$_{y'}$:H |
| 207 | n$^+$ | a-Si:H | a-Si:H | a-Si:H | a-Si:H | a-Si:H |
| 206 | p$^+$ | a-Si:H | a-Si:H | a-Si:H | a-Si:H | a-Si:H |
| 205 | i | a-Si:H | a-Si:H | a-Si:H | a-Si:H | a-Si:H |
| 204 | n$^+$ | a-Si:H | a-Si:H | a-Si:H | a-Si:H | a-Si:H |
| 203 | p$^+$ | a-Si:H | a-Si:H | a-Si:H | a-Si:H | a-Si:H |
| 211 | i | a-Si$_{1-x'}$Ge$_{x'}$:H | a-Si$_{1-x'}$Ge$_{x'}$:H | a-Si$_{1-x'}$Ge$_{x'}$:H | GaAs$_{1-x'}$P$_{x'}$:H | GaAs$_{1-x'}$P$_{x'}$:H |
| the remaining part of 202 | i | a-Si$_{1-x}$Ge$_x$:H | a-Si$_{1-x}$Ge$_x$:H | a-Si$_{1-x}$Ge$_x$:H | GaAs:H | GaAs:H |
| 201 | n$^+$ | a-Si:H | a-Si:H | a-Si:H | GaAs:H | GaAs:H |

| reference numeral in FIG. 2 | conduction type of the constituent semiconductor layer | No. 12 | No. 13 | No. 14 | No. 15 |
|---|---|---|---|---|---|
| 209 | p$^+$ | a-Si$_{1-z}$C$_z$:H | a-Si$_{1-y}$C$_y$:H | ZnSe:H | a-Si$_{1-z}$C$_z$:H |
| the remaining part of 208 | i | CdS:H | a-Si$_{1-y}$C$_y$:H | ZnSe:H | CdS:H |
| 212 | i | CdS$_{1-y'}$Te$_{y'}$:H | a-Si$_{1-y'}$C$_{y'}$:H | ZnSe$_{1-y'}$Te$_{y'}$:H | CdS$_{1-y'}$Te$_{y'}$:H |
| 207 | n$^+$ | a-Si:H | a-Si:H | a-Si:H | a-Si:H |
| 206 | p$^+$ | a-Si:H | a-Si:H | a-Si:H | a-Si:H |
| 205 | i | a-Si:H | a-Si:H | a-Si:H | a-Si:H |
| 204 | n$^+$ | a-Si:H | a-Si:H | a-Si:H | a-Si:H |
| 203 | p$^+$ | a-Si:H | a-Si:H | a-Si:H | a-Si:H |
| 211 | i | GaAs$_{1-x'}$P$_{x'}$:H | Ga$_{1-x'}$In$_{x'}$As:H | Ga$_{1-x'}$In$_{x'}$As:H | Ga$_{1-x'}$In$_{x'}$As:H |
| the remaining part of 202 | i | GaAs:H | GaAs:H | GaAs:H | GaAs:H |
| 201 | n$^+$ | GaAs:H | GaAs:H | GaAs:H | GaAs:H |

TABLE 12

| semiconductor film | raw material gas | flow rate (sccm) | inner pressure (Torr) | substrate temperature (°C.) | RF power (W) |
|---|---|---|---|---|---|
| a-Si:H | SiH$_4$ | 30 | 0.5 | 250 | 50 |
| | H$_2$ | 40 | | | |
| a-Si:H:F | SiF$_4$ | 20 | 0.5 | 250 | 100 |
| | H$_2$ | 50 | | | |
| μC-Si:H | SiH$_4$ | 5 | 0.5 | 250 | 200 |
| | H$_2$ | 100 | | | |
| μC-Si:H:F | SiF$_4$ | 10 | 0.5 | 250 | 200 |
| | H$_2$ | 100 | | | |
| a-Si$_{0.86}$Ge$_{0.14}$:H | SiH$_4$ | 30 | 0.5 | 250 | 50 |
| | GeH$_4$ | 1.2 | | | |
| | H$_2$ | 40 | | | |
| a-Si$_{0.86}$Ge$_{0.14}$:H:F | SiF$_4$ | 20 | 0.5 | 250 | 100 |
| | GeF$_4$ | 1.0 | | | |
| | H$_2$ | 50 | | | |
| a-Si$_{0.87}$C$_{0.13}$:H | SiH$_4$ | 30 | 0.5 | 250 | 50 |
| | CH$_4$ | 40 | | | |
| | H$_2$ | 6.5 | | | |
| μC-Si$_{0.87}$C$_{0.13}$:H:F | SiF$_4$ | 10 | 0.5 | 250 | 350 |
| | CF$_4$ | 5 | | | |
| | H$_2$ | 100 | | | |
| a-Si$_{0.9}$N$_{0.1}$:H | SiH$_4$ | 30 | 0.5 | 250 | 50 |
| | NH$_4$ | 5 | | | |
| | H$_2$ | 40 | | | |

| semiconductor film | raw material gas | flow rate | inner pressure (Torr) | substrate temperature (°C.) | RF power (W) |
|---|---|---|---|---|---|
| a-Si$_{0.9}$O$_{0.1}$:H | SiH$_4$ | 30 sccm | 0.5 | 250 | 50 |
| | H$_2$O | 2 sccm | | | |
| | H$_2$ | 40 sccm | | | |
| GaAs:H | Ga(C$_2$H$_5$)$_3$ | 2.0 × 10$^{-5}$ mol/min | 0.5 | 200 | 50 |
| | AsH$_3$ | 15 sccm | | | |
| | H$_2$ | 15 sccm | | | |
| GaAs$_{0.5}$P$_{0.5}$:H | Ga(C$_2$H$_5$)$_3$ | 2.0 × 10$^{-5}$ mol/min | 0.5 | 200 | 50 |
| | AsH$_3$ | 17.5 sccm | | | |
| | PH$_3$ | 7.5 sccm | | | |
| | H$_2$ | 15 sccm | | | |
| Ga$_{0.5}$In$_{0.5}$P:H | Ga(C$_2$H$_5$)$_3$ | 1.2 × 10$^{-5}$ mol/min | 0.5 | 200 | 50 |

TABLE 12-continued

| | | |
|---|---|---|
| In(C$_2$H$_5$)$_3$ | 0.8 × 10$^{-5}$ mol/min | |
| PH$_3$ | 15 sccm | |
| H$_2$ | 15 sccm | |

TABLE 13

| semiconductor film | raw material gas | flow rate | inner pressure (Torr) | substrate temperature (°C.) | microwave power (W) |
|---|---|---|---|---|---|
| a-Si:H:F | (A)H$_2$/Ar<br>(B)SiF$_4$ | 20 sccm/100 sccm<br>30 sccm | 0.2 | 250 | 200 |
| μC-Si:H:F | (A)H$_2$/Ar<br>(B)SiF$_4$ | 20 sccm/100 sccm<br>5 sccm | 0.2 | 250 | 200 |
| a-Si$_{0.86}$Ge$_{0.14}$:H:F | (A)H$_2$/Ar<br>(B)SiF$_4$<br>GeF$_4$ | 20 sccm/100 sccm<br>30 sccm<br>0.5 sccm | 0.2 | 250 | 200 |
| μC-Si$_{0.87}$C$_{0.13}$:H:F | (A)H$_2$/Ar<br>(B)SiF$_4$<br>CF$_4$ | 20 sccm/100 sccm<br>5 sccm<br>5 sccm | 0.2 | 250 | 300 |
| a-Si$_{0.9}$N$_{0.1}$:H | (A)H$_2$/Ar<br>(B)SiF$_4$<br>NF$_3$ | 20 sccm/100 sccm<br>30 sccm<br>3 sccm | 0.5 | 250 | 200 |
| ZnSe:H | (A)H$_2$<br>(B)<br>Zn(C$_2$H$_5$)$_2$<br>Se(C$_2$H$_5$)$_2$ | 15 sccm<br><br>1.0 × 10$^{-6}$ mol/min<br>1.5 × 10$^{-5}$ mol/min | 0.5 | 200 | 200 |
| ZnSe$_{0.2}$Te$_{0.8}$:H | (A)H$_2$<br>(B)<br>Zn(C$_2$H$_5$)$_2$<br>Se(C$_2$H$_5$)$_2$<br>Te(C$_2$H$_5$)$_2$ | 15 sccm<br><br>1.0 × 10$^{-6}$ mol/min<br>3.0 × 10$^{-6}$ mol/min<br>8.0 × 10$^{-6}$ mol/min | 0.5 | 200 | 200 |
| GaAs:H | (A)H$_2$<br>(B)<br>Ga(C$_2$H$_5$)$_2$<br>AsH$_3$ | 15 sccm<br><br>1.5 × 10$^{-5}$ mol/min<br>10 sccm | 0.5 | 200 | 100 |

TABLE 14

| semiconductor film | target | flow rate (sccm) | inner pressure (mTorr) | substrate temperature (°C.) | RF power (W) |
|---|---|---|---|---|---|
| a-Si:H | Si | Ar: 10<br>H$_2$: 1 | 5 | 250 | 300 |
| a-Si:F | Si | Ar: 10<br>SiF$_4$: 0.5 | 5 | 250 | 300 |
| a-Si$_{0.86}$Ge$_{0.14}$:H | Si + Ge (wafer) | Ar: 10<br>H$_2$: 1 | 5 | 250 | 300 |
| a-Si$_{0.87}$C$_{0.13}$:H | Si + graphite | Ar: 10<br>H$_2$: 2.5 | 5 | 250 | 300 |
| CdS:H | CdS | Ar: 10<br>H$_2$: 0.2 | 5 | 200 | 200 |
| CdS$_{0.5}$Te$_{0.5}$:H | CdS + CdTe (wafer) | Ar: 10<br>H$_2$: 0.2 | 5 | 200 | 200 |
| GaAs:H | GaAs | Ar: 10<br>H$_2$: 0.5 | 5 | 200 | 300 |
| GaAs$_{0.5}$P$_{0.5}$:H | GaAs + Gap (wafer) | Ar: 10<br>H$_2$: 0.5 | 5 | 200 | 300 |
| Ga$_{0.5}$In$_{0.5}$P:H | GaAs + InP (wafer) | Ar: 10<br>H$_2$: 0.5 | 5 | 200 | 300 |

What is claimed is:

1. A photovoltaic device which comprises a plurality of stacked photovoltaic elements, wherein at least one photovoltaic element thereof comprises a semiconductor layer (a) having a refractive index na and a semiconductor layer (b) having a refractive index nb and a semiconductor layer (c) positioned between said semiconductor layer (a) and said semiconductor layer (b) as an antireflection layer; wherein the constituent elements of said semiconductor layer (c) have a composition ratio different from the composition ratio of the constituent elements of both said semiconductor layer (a) and said semiconductor layer (b); said semiconductor layer (c) having a refractive index nc=$\sqrt{na.nb}$ and a thickness (d) d=$\lambda/4\sqrt{na.nb}$ in which λ represents a peak wavelength of the spectrum sensitivity of an adjacent photovoltaic element positioned in the direction of light transmission.

2. A stacked photovoltaic device according to claim 1, wherein the semiconductor layer (b) comprises an a-Si$_{1-x}$Ge$_x$:H film and the semiconductor film constituting the semiconductor layer (c) comprises an a-Si$_{1-x}$Ge$_x$:H film, where x'≠x, 0<x, x'<1.

3. A stacked photovoltaic device according to claim 1, wherein the semiconductor layer (b) comprises an a-Si$_{1-x}$C$_x$:H film and the semiconductor film constituting the semiconductor layer (c) comprises an a-Si$_{1-x}$C$_x$:H film, where x'≠, 0<x, x'<1.

4. A photovoltaic device which comprises a plurality of stacked photovoltaic elements wherein at least one element thereof comprises a semiconductor layer (a) having a refractive index na and a semiconductor layer (b) having a refractive index nb and a semiconductor layer (c) positioned between said semiconductor layer (a) and said semiconductor layer (b) as an antireflection layer; wherein said semiconductor layer (c) comprises a semiconductor film having an elemental composition in which other elements are added to the constituent elements of said semiconductor layer (b) and said semiconductor layer (c) having a refractive index $nc = \sqrt{na \cdot nb}$ and a thickness $d = \lambda/4\sqrt{na \cdot nb}$ in which $\lambda$ represents a peak wavelength of the spectrum sensitivity of an adjacent photovoltaic element positioned in the direction of light transmission.

5. A stacked photovoltaic device according to claim 4, wherein the semiconductor layer (b) comprises an a-Si:H film and the semiconductor film constituting the semiconductor layer (c) comprises an a-Si$_{1-x}$N$_x$:H film, where $0 < x < 1$.

6. A stacked photovoltaic device according to claim 4, wherein the semiconductor layer (b) comprises an a-Si:H film and the semiconductor film constituting the semiconductor layer (c) comprises an a-Si$_{1-x}$O$_x$:H film, where $0 < x < 1$.

7. A stacked photovoltaic device according to claim 4, wherein the semiconductor layer (b) comprises an ZnSe:H film and the semiconductor film constituting the
semiconductor layer (c) comprises a ZnSe$_{1-x}$Te$_x$:H film, where $0 < x < 1$.

8. A stacked photovoltaic device according to claim 4, wherein the semiconductor layer (b) comprises a CdS:H film and the semiconductor film constituting the semiconductor layer (c) comprises a CdS$_{1-x}$Te$_x$:H film, where $0 < x < 1$.

9. A stacked photovoltaic device according to claim 4, wherein the semiconductor layer (b) comprises a GaAs H film and the semiconductor film constituting the semiconductor layer (c) comprises a GaAs$_{1-x}$P$_x$:H film, where $0 < x < 1$.

10. A stacked photovoltaic device according to claim 4, wherein the semiconductor layer (b) comprises a GaAs:H film and the semiconductor film constituting the semiconductor layer (c) comprises a Ga$_{1-x}$In$_x$As:H film, where $0 < x < 1$.

* * * * *

UNITED STATES PATENT AND TRADEMARK OFFICE
CERTIFICATE OF CORRECTION

PATENT NO. : 5,039,354

DATED : August 13, 1991

INVENTOR(S) : Katsumi Nakagawa

Page 1 of 7

It is certified that error appears in the above-indentified patent and that said Letters Patent is hereby corrected as shown below:

On the title page, Items

IN [56] REFERENCES CITED

U.S. PATENT DOCUMENTS, "4,542,256  9/1985  Wideman" should read --4,542,256  9/1985  Wiedeman--.

IN [57] ABSTRACT

Line 8, "constitutent" should read --constituent--.
Line 10, "layer (a)" should read --layers (a)--.

COLUMN 1

Line 18, "Of The" should read --of the--.
Line 23, "example(" should read --example,--.
Line 29, "and" should read --and because--.
Line 67, "wavelength v" should read --wavelength $\lambda$--.

COLUMN 2

Line 16, "SiH" should read --$SiH_4$--.
Line 16, "CH" should read --$CH_4$--.
Line 28, "for 0.7 V" should read --for Voc is about 0.9 V whereas the value for Voc is about 0.7 V--.
Line 42, "can not" should read --cannot--.
Line 61, "can not" should read --cannot--.

COLUMN 3

Line 49, "nc = $\sqrt{na.nb}$" should read --n = $\sqrt{na.nb}$--.
Line 64, "nc = $\sqrt{na.nb}$" should read --n = $\sqrt{na.nb}$--.

UNITED STATES PATENT AND TRADEMARK OFFICE
CERTIFICATE OF CORRECTION

PATENT NO. : 5,039,354
DATED : August 13, 1991
INVENTOR(S) : Katsumi Nakagawa

It is certified that error appears in the above-indentified patent and that said Letters Patent is hereby corrected as shown below:

COLUMN 4

Line 22, "stacked" should read --stacked.--.

COLUMN 5

Line 2, "ISc" should read --Isc--.
Line 51, "10 Torr." should read --$10^{-5}$ Torr.--.
Line 54, "SiH" should read --$SiH_4$--.
Line 64, "Hz" should read --$H_2$--.
Line 67, "GeH" should read --$GeH_4$--.

COLUMN 6

Line 11, "$A-Si_{1-x}C_x:H$" should read --$a-Si_{1-x}C_x:H$--.
Line 12, "$A-Si_{1-x}C_x:H$" should read --$a-Si_{1-x}C_x:H$--.
Line 19, "0.5." should read --0.5--.
Line 42, "chrometor" should read --chromator--.
Line 64, "$A-Si_{1-x}GE_x:H$" should read --$a-Si_{1-x}Ge_x:H$--.
Line 65, "$a-Si_{1-x}Ge_x:H$" should read --$a-Si_{0.7}C_{0.3}:H$--.

COLUMN 7

Line 27, "a-SiC" should read --a- --.
Line 35, "$a-Si_{0.4}Ge_{0.4}:H$" should read --$a-Si_{0.6}Ge_{0.4}:H$--.
Line 55, "(1)" should read --¶ (1)--.

COLUMN 8

Line 10, "$a-Si_{0.86}Ge_{0.14}$" should read --$a-Si_{0.86}Ge_{0.14}:H$--.

UNITED STATES PATENT AND TRADEMARK OFFICE
CERTIFICATE OF CORRECTION

PATENT NO. : 5,039,354

DATED : August 13, 1991

INVENTOR(S) : Katsumi Nakagawa

Page 3 of 7

It is certified that error appears in the above-indentified patent and that said Letters Patent is hereby corrected as shown below:

COLUMN 8

Line 21, "n $\sqrt{2.7 \times 4.0}$ = 3.29" should read --n $\sqrt{2.7 \times 4.0}$ = 3.29--.

Line 22, "a -$Si_{0.87}C_{0.13}$" should read --a-$Si_{0.87}C_{0.13}$:H--.

Line 24, "d = 633/4 X 3 = 48.0" should read --d = 633/4 X 3.3 = 48.0--.

Line 41, "other" should read --another--.

COLUMN 9

Line 42, "semiconductors" should read --semiconductors.--.

Line 48, "F." should read --G.--.

Line 65, "as:" should read --as--.

COLUMN 10

Line 23, "85" should read --85%--.

Line 25, ""$ZnSe_{1-x}=Te_x$:H film"" should read --"$ZnSe_{1-x}Te_x$:H film"--.

Line 31, "$ZnSe_{1-x}=Te_x$:H" should read --$ZnSe_{1-x}Te_x$:H--.

Line 52, "1.0 X 10.$^{-6}$" should read --1.0 X $10^{-6}$--.

COLUMN 11

Line 14, "G." should read --H.--.

Line 33, "n-type Si:H film," should read --n-type semiconductor layer 207 constituted with a n-type a-Si:H film,--.

Line 34, "a" (second occurrence) should read --and a--.

UNITED STATES PATENT AND TRADEMARK OFFICE
CERTIFICATE OF CORRECTION

PATENT NO. : 5,039,354  
DATED : August 13, 1991  
INVENTOR(S) : Katsumi Nakagawa It is certified that error appears in the above-indentified patent and that said Letters Patent is hereby corrected as shown below:

COLUMN 13

Line 1, "an" should read --and--.  
Line 62, "a-$Si_{1-x}Ge_x$:H" should read --a-$Si_{1-x}·Ge_{x·}$:H--.  
Line 66, "a-$Si_{1-x}Ge_x$:H" should read --a-$Si_{1-x}·Ge_{x·}$:H--.

COLUMN 14

Line 5, "$_{-y}C_y$:H" should read --$_{-y·}C_{y·}$:H--.  
Line 8, "a-$Si_{1-y}$," should read --a-$Si_{1-y·}C_{y·}$:H--.  
Line 9, "$C_y$:H," should be deleted.  
Line 12, "the" (second occurrence) should read --and the--.  
Line 46, "a-$Si_{1-x}$:F," should read --a-$Si_{1-x}C_x$:F,--.  
Line 50, "a-$Si_{1-x}$,$N_x$:H:F," should read --a-$Si_{1-x}N_x$:H:F,--.  
Line 51, "$Si_{1-x},C_x$:H:F" should read --$Si_{1-x}C_x$:H:F-- and "$CdS_{1-x}Te_xH$:F" should read --$CdS_{1-x}Te_x$:H:F--.  
Line 66, "SiF" should read --$SiF_4$--.

COLUMN 15

Line 10, "example" should read --example,--.  
Line 21, "the-" should read --the--.  
Line 27, "a-$Si_{1-x}C_{1-x}$:F" should read --a-$Si_{1-x}C_x$:F--.  
Line 31, "$C_2H_2$," should read --$C_2H_4$, $C_2H_2$,-- and "$CFH_2H_2$" should read --$CF_2H_2$--.  
Line 39, "$O_x$:H" should read --$O_x$:H--.  
Line 47, "Ga($C_2H_5$)" should read --Ga($C_2H_5$)$_3$--.  
Line 54, Ga($CH_2$)$_2$" should read --Ga($CH_3$)$_3$--.  
Line 59, "portions," should read --portions--.

UNITED STATES PATENT AND TRADEMARK OFFICE
CERTIFICATE OF CORRECTION

PATENT NO. : 5,039,354
DATED : August 13, 1991
INVENTOR(S) : Katsumi Nakagawa

It is certified that error appears in the above-indentified patent and that said Letters Patent is hereby corrected as shown below:

COLUMN 16

Line 9, "sometime" should read --sometimes--.
Line 17, "$H_2$or," should read --$H_2$ or--.
Line 18, "case" should read --case,--.
Line 22, "a-Si H" should read --a-Si:H--.
Line 31, "a-Si:H:F" should read --a-Si:H:F film--.
Line 32, "$Ge_2F_4$" should read --$Ge_2F_6$--.
Line 34, "a-$Si_{1-x}$,$C_x$:H" should read --a-$Si_{1-x}C_x$:H--.
Line 37, "$CH_{cl}$." should read --$CH_3Cl$.--.
Line 41, "preforming" should read --forming--.
Line 50, "Ga($CH_3$):" should read --Ga($CH_3$)$_3$--.
Line 58, "In($C_2H_5$);" should read --In($C_2H_5$)$_3$;--.
Line 62, "HRCVD" should read --HR-CVD--.

COLUMN 17

Line 34, "5 mm" should read --0.5--.

COLUMN 18

Line 2, "that" should read --than--.
Line 23, "a-$Si_{0.4}Ge_{0.4}$:H" should read --a-$Si_{0.6}Ge_{0.4}$:H--.
Line 36, "discharge" should read --and discharge--.
Line 37, "pressure" should read --pressure and--.
Line 44, "a-$Si_{0.87}$,$C_{0.13}$:H" should read --a-$Si_{0.87}C_{0.13}$:H--.
Line 45, "and" should read --,--.
Line 46, "gas," (first occurrence) should read --gas, and--.
Line 63, "$Si_{0.7}C_{0.03}$:H" should read --$Si_{0.7}C_{0.3}$:H--.

UNITED STATES PATENT AND TRADEMARK OFFICE
CERTIFICATE OF CORRECTION

PATENT NO. : 5,039,354

DATED : August 13, 1991

INVENTOR(S) : Katsumi Nakagawa

It is certified that error appears in the above-indentified patent and that said Letters Patent is hereby corrected as shown below:

COLUMN 19

Line 66, "$B_2H_4$" should read --$B_2H_6$--.

COLUMN 20

Line 2, "from" should read --form--.
    Line 22, "a" should read --an--.
    Line 61, "are" should read --were--.

COLUMN 22

Line 8, "$LiC_3H_7$," should read --$LiC_3H_7$--.
    Line 16, "EVALUATIONS" should be a subhead.
    Line 23, "a" (first occurrence) should read --an--.
    Line 26, "a" (first occurrence) should read --an--.

COLUMN 27

TABLE 14, "Gap (wafer)" should read --GaP (wafer)--.
    Line 67, "(d)" should be deleted.

COLUMN 28

Line 61, "$Si_{1-x}Ge_x:H$" should read --$Si_{1-x}\cdot Ge_x\cdot :H$--.
    Line 66, "$Si_{1-x}C_x:H$" should read --$Si_{1-x}\cdot C_x\cdot :H$-- and "$x' \neq ,$" should read --$x' \neq x,$--.

COLUMN 29

Line 10, "and" should read --;--.

UNITED STATES PATENT AND TRADEMARK OFFICE
CERTIFICATE OF CORRECTION

PATENT NO. : 5,039,354
DATED : August 13, 1991
INVENTOR(S) : Katsumi Nakagawa

It is certified that error appears in the above-indentified patent and that said Letters Patent is hereby corrected as shown below:

COLUMN 30

```
Line 6,  Close up right margin.
Line 7,  Close up left margin.
Line 8,  Close up left margin.
Line 16, "GaAs H" should read --GaAs:H--.
```

Signed and Sealed this

Twenty-eighth Day of December, 1993

Attest:

BRUCE LEHMAN

*Attesting Officer*  *Commissioner of Patents and Trademarks*